(12) United States Patent
Mori

(10) Patent No.: US 10,838,259 B2
(45) Date of Patent: Nov. 17, 2020

(54) LIQUID CRYSTAL DISPLAY

(71) Applicant: Sharp Kabushiki Kaisha, Osaka (JP)

(72) Inventor: Takahiro Mori, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 610 days.

(21) Appl. No.: 14/397,897

(22) PCT Filed: May 9, 2013

(86) PCT No.: PCT/JP2013/063022
§ 371 (c)(1),
(2) Date: Oct. 30, 2014

(87) PCT Pub. No.: WO2013/172243
PCT Pub. Date: Nov. 21, 2013

(65) Prior Publication Data
US 2015/0138466 A1 May 21, 2015

(30) Foreign Application Priority Data

May 16, 2012 (JP) .................................. 2012-112771

(51) Int. Cl.
*G02F 1/1339* (2006.01)
*G02F 1/1362* (2006.01)
(Continued)

(52) U.S. Cl.
CPC .......... *G02F 1/1339* (2013.01); *G02F 1/1345* (2013.01); *G02F 1/1368* (2013.01);
(Continued)

(58) Field of Classification Search
CPC ............. G02F 1/133345; G02F 1/1339; G02F 1/136213; G02F 1/13454;
(Continued)

(56) References Cited

U.S. PATENT DOCUMENTS

2003/0189542 A1 10/2003 Lee et al.
2006/0022201 A1 2/2006 Kim et al.
(Continued)

FOREIGN PATENT DOCUMENTS

EP          2 840 566 A1    2/2015
JP          2005-522734 A   7/2005
(Continued)

OTHER PUBLICATIONS

Official Communication issued in International Patent Application No. PCT/JP2013/063022, dated Jul. 16, 2013.

*Primary Examiner* — Patrick N Edouard
*Assistant Examiner* — Douglas M Wilson
(74) *Attorney, Agent, or Firm* — Keating & Bennett, LLP

(57) ABSTRACT

The present invention provides a liquid crystal display that can reduce occurrence of quality problems and improve adhesive strength between substrates. The present invention is a liquid crystal display including a first substrate, a second substrate, and a seal. The first substrate includes a shift register monolithically formed on an insulating substrate, a plurality of bus lines, a first end, and a display region. The shift register includes a plurality of multistage-connected unit circuits and wiring connected to the plurality of unit circuits, and is arranged in a region between the first end and the display region. At least one of the unit circuits includes a clock terminal, an output terminal, an output transistor, a second transistor, and a bootstrap capacitor. The output transistor and the bootstrap capacitor are arranged in a region between the first end and one of the wiring and the second transistor.

9 Claims, 16 Drawing Sheets

(51) Int. Cl.
*G11C 19/28* (2006.01)
*G09G 3/36* (2006.01)
*G02F 1/1333* (2006.01)
*G02F 1/1368* (2006.01)
*G02F 1/1345* (2006.01)
*G02F 1/1335* (2006.01)

(52) U.S. Cl.
CPC .. *G02F 1/133345* (2013.01); *G02F 1/133512* (2013.01); *G02F 1/136213* (2013.01); *G09G 3/3677* (2013.01); *G11C 19/28* (2013.01); *G11C 19/287* (2013.01); *G09G 2300/0408* (2013.01); *G09G 2310/0286* (2013.01)

(58) Field of Classification Search
CPC ... G09G 2300/0408; G09G 2310/0286; G09G 3/3677; G09G 2300/0426; G11C 19/28; G11C 19/287
See application file for complete search history.

(56) References Cited

U.S. PATENT DOCUMENTS

| | | | |
|---|---|---|---|
| 2006/0056267 | A1 | 3/2006 | Kim et al. |
| 2006/0066604 | A1 | 3/2006 | Yang |
| 2006/0161693 | A1 | 7/2006 | Lee et al. |
| 2008/0018572 | A1 | 1/2008 | Shin et al. |
| 2008/0284698 | A1* | 11/2008 | Lee ................. G11C 19/28 345/87 |
| 2008/0284963 | A1 | 11/2008 | Kamiya et al. |
| 2009/0303427 | A1* | 12/2009 | Kondo ............... G02F 1/1339 349/153 |
| 2010/0134396 | A1* | 6/2010 | Umezaki ............. G09G 3/3413 345/92 |
| 2010/0141622 | A1 | 6/2010 | Kim et al. |
| 2010/0156858 | A1* | 6/2010 | Moon ................. G09G 3/3674 345/204 |
| 2010/0283931 | A1 | 11/2010 | Horiuchi et al. |
| 2011/0012880 | A1 | 1/2011 | Tanaka et al. |
| 2012/0032615 | A1 | 2/2012 | Kikuchi et al. |
| 2012/0068173 | A1* | 3/2012 | Umezaki ............. H01L 27/1222 257/43 |
| 2012/0162179 | A1 | 6/2012 | Tanaka et al. |
| 2012/0229712 | A1 | 9/2012 | Yoshida et al. |
| 2012/0327057 | A1 | 12/2012 | Sakamoto et al. |
| 2013/0039455 | A1 | 2/2013 | Horiuchi et al. |
| 2017/0033125 | A1* | 2/2017 | Umezaki ............. H01L 27/124 |
| 2019/0280022 | A1* | 9/2019 | Umezaki ........... G02F 1/136286 |

FOREIGN PATENT DOCUMENTS

| | | |
|---|---|---|
| JP | 2006-039524 A | 2/2006 |
| JP | 2006-079041 A | 3/2006 |
| JP | 2006-091813 A | 4/2006 |
| JP | 2007-065037 A | 3/2007 |
| JP | 2008-026865 A | 2/2008 |
| JP | 2008-139604 A | 6/2008 |
| JP | 2009-210965 A | 9/2009 |
| WO | 2006/098475 A1 | 9/2006 |
| WO | 2009/128179 A1 | 10/2009 |
| WO | 2009/150862 A1 | 12/2009 |
| WO | 2010/137197 A1 | 12/2010 |
| WO | 2011/036911 A1 | 3/2011 |
| WO | 2011/067963 A1 | 6/2011 |
| WO | 2011/104945 A1 | 9/2011 |
| WO | 2011/135873 A1 | 11/2011 |

* cited by examiner

LIQUID CRYSTAL DISPLAY

TECHNICAL FIELD

The present invention relates to a liquid crystal display. More particularly, the present invention relates to a liquid crystal display preferred for a liquid crystal display including a shift register.

BACKGROUND ART

An active matrix liquid crystal display typically displays an image by selecting pixels arranged in a matrix on a row-by-row basis and writing a voltage in accordance with display data in the selected pixels. In order to select pixels on a row-by-row basis, a shift register for sequentially shifting an output signal (scanning signal) based on a clock signal is provided in a gate bus line drive circuit (hereinafter referred to as a gate driver).

The gate driver may be formed simultaneously with a thin film transistor (TFT) in a pixel by using a manufacturing process for forming the TFT in the pixel. For example, when a TFT in a pixel is formed using amorphous silicon, in order to reduce manufacturing costs, preferably the shift register included in the gate driver is also formed using amorphous silicon. In this way, recently, the gate driver has been monolithically formed on an array substrate in some cases.

In addition, a one drop filling method (ODF method) has been developed in recent years as a method for filling the interior of a liquid crystal panel of a liquid crystal display with a liquid crystal material. The one drop filling method makes it possible to perform a process of bonding two substrates together and a process of filling the interior of the two substrates with the liquid crystal material simultaneously.

Examples of techniques for monolithic formation of the gate driver include the following.

A display device is disclosed. In the display device, a display panel includes a first substrate including a plurality of gate lines and a plurality of data lines, a second substrate facing the first substrate, and a sealing material for bonding the first substrate and the second substrate. A gate driving unit includes a wiring section for receiving a plurality of signals from outside and a circuit section for outputting a driving signal in response to the plurality of signals. The wiring section includes an aperture for transmitting light incident through a back of the first substrate for hardening the sealing material (for example, see Patent Literature 1). Patent Literature 1 describes an improvement in bonding force between the first substrate and the second substrate by the sealing material.

A drive unit including a circuit section and a wiring section is disclosed. The circuit section includes a plurality of cascade-connected stages and outputs a driving signal based on a plurality of control signals. The wiring section includes first and second signal wiring for receiving a plurality of control signal inputs from outside, first connection wiring for connecting the first signal wiring to the plurality of stages, and second connection wiring for connecting the second signal wiring to the plurality of stages. The first signal wiring, the first connection wiring, and the second connection wiring are arranged in a layer different from a layer of the second signal wiring (for example, see Patent Literature 2).

A display substrate including gate wiring, a drive circuit section, a signal wiring section, a connection wiring section, and a contact section is disclosed. The gate wiring is formed in a display region and intersects source wiring. The drive circuit section is formed in a peripheral region surrounding the display region and outputs a gate signal to the gate wiring. The signal wiring section is formed adjacent to the drive circuit section, extends in an extending direction of the source wiring, and conveys a driving signal. The connection wiring section includes an end overlapping the signal wiring section and the other end connected to the drive circuit section electrically. The contact section is formed on the signal wiring section and electrically connects the one end of the connection wiring section to the signal wiring section (for example, see Patent Literature 3).

A drive circuit including a plurality of drive stages and a dummy stage is disclosed. The plurality of drive stages are cascade-connected to each other by an output terminal of each stage being connected to a control terminal of a previous stage. The plurality of drive stages output switching element driving signals to a plurality of driving signal lines each connected to a switching element formed on each pixel arranged in a matrix. In the dummy stage, a dummy output terminal is connected to each of a control terminal of a last stage among the plurality of drive stages and its own dummy control terminal (for example, see Patent Literature 4).

A liquid crystal display device is disclosed. In the liquid crystal display device, conventional first auxiliary capacitive trunk wiring is formed to have a narrow width, and new second auxiliary capacitive trunk wiring is further provided and arranged in a position that is the closest to the outer edge portion of a substrate (for example, see Patent Literature 5). The fifth embodiment and FIG. 13 of Patent Literature 5 describe a structure in which a slit aperture is provided in a second auxiliary capacitive trunk wiring 440 and wiring 420a for DC voltage VSS with the largest width among driving signal supply trunk wiring 420.

A TFT is disclosed including a first capacitor formed of a first capacitive electrode and a second capacitive electrode, a second capacitor formed of a third capacitive electrode and a fourth capacitive electrode, first lead-out wiring, second lead-out wiring connected to a gate electrode, third lead-out wiring, fourth lead-out wiring, a first wire, and a second wire (for example, see Patent Literature 6).

A shift register including multistage-connected unit circuits is disclosed. Each of the unit circuits is provided between a clock terminal and an output terminal, and includes an output transistor for switching whether to pass a clock signal depending on gate potential, and one or more control transistors with one conducting terminal connected to a gate of the output terminal. The unit circuit is configured so that the gate potential of the output transistor is higher than high-level potential of the clock signal in a period in which the output transistor is turned on and the clock signal is high-level. The control transistors include a transistor with a channel length longer than a channel length of the output transistor (for example, see Patent Literature 7).

A shift register including a plurality of cascade-connected shift register stages on a substrate is disclosed. Each of the shift register stages includes a first transistor including a capacitive electrode facing at least one of two sources/drain electrodes on an opposite side of a gate electrode in a film thickness direction. Either one of the capacitive electrode and one of the source/drain electrodes facing the capacitive electrode is electrically connected to a control electrode of an output transistor of the shift register stage (for example, see Patent Literature 8).

Examples of techniques for one drop filling method include the following.

A liquid crystal display panel is disclosed. The liquid crystal display panel includes a TFT substrate, a color filter (CF) substrate arranged to face the TFT substrate, a sealing material sandwiched between the TFT substrate and the CF substrate and formed in a peripheral portion of the two substrates, and a liquid crystal layer arranged between the TFT substrate and the CF substrate. The CF substrate has a light shielding layer in the peripheral portion in which the sealing material is provided. The light shielding layer has a gap in a region overlapping wiring of the TFT substrate (for example, see Patent Literature 9).

A liquid crystal display panel is disclosed. The liquid crystal display panel includes an active matrix substrate and an opposed substrate arranged opposite to each other, and a liquid crystal layer provided between the two substrates, wherein a display region and a non-display region in the periphery thereof are defined. In the non-display region, a frame-shaped seal portion including a light-hardening material is provided between both substrates and has a linear portion with a narrow width and a wide portion wider than the linear portion, pattern formation of light shielding display wiring is performed on the active matrix substrate, a black matrix formed along an inner periphery end of the seal portion and having a cutout at a position corresponding to the wide portion is provided on the opposed substrate (for example, see Patent Literature 10).

A method of manufacturing a liquid crystal optical element is disclosed. The method includes a seal formation process of forming a closed-circular ultraviolet-hardening seal on a first transparent substrate, a liquid crystal dropping process of dropping a liquid crystal in a region surrounded by the seal, and a main seal hardening process of performing main hardening of the seal after bonding a second transparent substrate to the first transparent substrate via the seal with a predetermined gap. A provisional seal hardening process is performed between the seal formation process and the liquid crystal dropping process in which a seal inner region is irradiated with the ultraviolet light through a mask having a light shielding portion to perform provisional hardening of a partial region of the seal (for example, see Patent Literature 11).

CITATION LIST

Patent Literature

Patent Literature 1: JP 2006-39524 A
Patent Literature 2: JP 2006-79041 A
Patent Literature 3: JP 2008-26865 A
Patent Literature 4: JP 2005-522734 T
Patent Literature 5: WO 2011/067963
Patent Literature 6: WO 2009/150862
Patent Literature 7: WO 2010/137197
Patent Literature 8: WO 2011/135873
Patent Literature 9: WO 2006/098475
Patent Literature 10: JP 2007-65037 A
Patent Literature 11: JP 2009-210965 A

SUMMARY OF INVENTION

Technical Problem

With reference to FIG. 19, a liquid crystal display according to Comparative Embodiment 1 will be described. The liquid crystal display according to Comparative Embodiment 1 includes an array substrate, an opposed substrate, a seal for bonding both substrates together, and a shift register monolithically formed on the array substrate. The shift register includes an output transistor Tr11 connected to a gate bus line, a bootstrap capacitor CB11 connected to the output transistor Tr11, transistors Tr12 to Tr14, and a wiring group 178 including wirings 174 to 176.

The liquid crystal display according to Comparative Embodiment 1 is produced by a one drop filling method. The seal includes a hardened material of a light-hardening (for example, ultraviolet-hardening) and thermo-hardening sealing material. The sealing material is hardened to some extent by light irradiation (provisional hardening), and is fully hardened by subsequent heat treatment (main hardening). The array substrate includes a strip region (hereinafter referred to as a seal-coating region) 163 sandwiched between thick dashed lines, and the seal is formed in a strip on the seal-coating region 163. One end of the seal-coating region 163 is set between the wiring group 178 and an end 110a of the array substrate, and the other end is set between the bootstrap capacitor CB11 and a region 177 in which the transistors Tr12 to Tr14 are arranged.

Here, it is desired that the seal is formed with a width as thin as possible from the following reasons.

The first reason is that an area of the output transistor Tr11 and the bootstrap capacitor CB11 increases resulting from higher resolution of a screen and/or a larger screen. As a result, a width of a region 164 in which the bootstrap capacitor CB11 and the output transistor Tr11 are arranged tends to become wider. Since the higher resolution and/or the larger screen involve a higher capability to apply predetermined voltage to a gate of a pixel transistor in a display region, that is, a higher application capability, the area of the output transistor Tr11 and the bootstrap capacitor CB11 increases.

The second reason is that a width of a picture-frame region in which a gate driver, a source driver, and the like are arranged tends to be narrower as part of pursuit of mobility of an electronic apparatus using a liquid crystal display. As a result, the width of the seal-coating region 163 tends to be narrower.

However, a narrower seal width leads to a smaller adhesion area between the array substrate and the seal, and a smaller adhesion area between the opposed substrate and the seal. Accordingly, peel strength of a panel against physical force applied to the liquid crystal display from outside becomes weaker. As a result, quality problems may occur, such as liquid crystal leakage.

If the sealing material is also coated on the output transistor Tr11 and the bootstrap capacitor CB11, light irradiation of the sealing material on the output transistor Tr11 and the bootstrap capacitor CB11 may be insufficient, and provisional hardening of the sealing material may not be fully performed. This is because the output transistor Tr11 and the bootstrap capacitor CB11 contain a light shielding electrode and function as light shielding members, and these members shield light. In this case, when a portion of the sealing material that has not undergone provisional hardening comes into contact with a liquid crystal material, a sealing material component may dissolve in the liquid crystal material, resulting in occurrence of quality problems, such as display failure. Therefore, in Comparative Embodiment 1, it is necessary to set the seal-coating region 163 in a region other than the output transistor Tr11 and the bootstrap capacitor CB11.

The technique described in Patent Literature 11 needs a mask having a light shielding portion in the provisional seal hardening process between the seal formation process and the liquid crystal dropping process, leading to higher unit prices of the liquid crystal display itself. In addition, the provisional seal hardening process needs to be performed before bonding first and second transparent substrates together, leading to longer time from the provisional hardening process until bonding of the both substrates together. Accordingly, there is a possibility of foreign particles, such as dust, mixing in a liquid crystal layer, causing display quality problems, such as a display bright defect.

In view of the above state of the art, it is an object of the present invention to provide a liquid crystal display that can reduce occurrence of quality problems, and can improve adhesive strength between substrates.

Solution to Problem

The present inventor made various investigations concerning a liquid crystal display that can reduce occurrence of quality problems and can improve adhesive strength between substrates, consequently has noted layout of elements and wiring contained in a shift register. Then, the present inventor found that, in the shift register arranged between a first end of an array substrate and a display region, by arranging an output transistor and a bootstrap capacitor in a region between the first end and members other than the output transistor and the bootstrap capacitor (in more detail, wiring or transistors other than the output transistor (second transistor)), it is possible to arrange the wiring and/or the second transistor on a display region side of the output transistor and the bootstrap capacitor. In addition, the present inventor found that it is possible to perform provisional hardening and main hardening of a sealing material in the region in which the wiring and/or the second transistor are arranged, whereas it is possible to perform main hardening of the sealing material in a region in which the output transistor and/or the bootstrap capacitor are arranged. Consequently, the present inventor found that it is possible to control a sealing material component dissolving in a liquid crystal layer, to set a coating region of the sealing material wider, and to control occurrence of liquid crystal leakage, and perceived that the above problems can be clearly solved. These findings have now led to completion of the present invention.

An aspect of the present invention is a liquid crystal display (hereinafter referred to as "display according to the present invention") including a first substrate, a second substrate facing the first substrate, and a seal provided in a region between the first substrate and the second substrate, wherein the first substrate includes an insulating substrate, a shift register monolithically formed on the insulating substrate, a plurality of bus lines, a first end, and a display region. The shift register includes a plurality of multistage-connected unit circuits and wiring connected to the plurality of unit circuits, and is arranged in a region between the first end and the display region. At least one of the plurality of unit circuits include a clock terminal into which a clock signal is input, an output terminal connected to a corresponding bus line and outputs an output signal, a first transistor (output transistor) with one of a source and a drain being connected to the clock terminal and the other of the source and the drain being connected to the output terminal, a second transistor, and a capacitor (bootstrap capacitor) with a first terminal connected to a gate of the first transistor and a second terminal connected to the output terminal. The first transistor and the capacitor are arranged in a region between the first end and one of the wiring and the second transistor.

The configuration of the display according to the present invention is not particularly limited by other components as long as the display is formed of these components as essential. Here, the shift register may include the plurality of pieces of wiring, and the at least one unit circuit may include the plurality of second transistors. In these cases, uses of the plurality of pieces of wiring usually differ from each other, and uses of the plurality of second transistors usually differ from each other.

Preferred embodiments in the display according to the present invention will be described below. The following preferred embodiments may be suitably combined with each other, and an embodiment that combines two or more of the following preferred embodiments with each other is also one of the preferred embodiments.

(A) Preferably, the first substrate includes a first region in which the wiring and/or the second transistor are arranged, and a second region in which the first transistor and/or the capacitor are arranged, the seal includes a first portion adjacent to the liquid crystal layer and a second portion adjacent to the first portion, and the first portion is arranged on the first region, and the second portion is arranged on the second region.

(B) The wiring and the second transistor may be arranged in a region between the display region and one of the first transistor and the capacitor.

In the embodiment (B), the wiring may be arranged in a region between the second transistor and the display region.

In the embodiment (B), the second transistor may be arranged in a region between the wiring and the display region.

(C) The first transistor and the capacitor may be arranged in a region between the wiring and the second transistor.

In the embodiment (C), the second transistor may be arranged in a region between the first end and one of the first transistor and the capacitor.

In the embodiment (C), the wiring may be arranged in a region between the first end and one of the first transistor and the capacitor. In this case, it is possible to protect the first and second transistors from static electricity that intrudes from outside by the wiring.

(D) One of the wiring and the second transistor may be arranged in a region between the display region and one of the first transistor and the capacitor, while the other of the wiring and the second transistor may be arranged in a region between the first transistor and the capacitor.

(E) Preferably, the seal includes a hardened article of a light-hardening and thermo-hardening material.

(F) Preferably, the second substrate includes a light shielding member that faces the shift register.

While the use of the wiring is not particularly limited, the following embodiment (G) is preferable.

(G) A pulse signal is transmitted through the wiring.

While the use of the bus line is not particularly limited, the following embodiment (H) is preferable. Each of the plurality of bus lines is connected in common to one row or one column of pixel circuits.

(H) Preferably, the first substrate includes a plurality of pixel circuits provided in the display region, each of the plurality of pixel circuits includes a pixel transistor and a pixel electrode connected to the pixel transistor, and each of the plurality of bus lines is connected to the plurality of corresponding pixel transistor gates.

Advantageous Effects of Invention

The present invention can achieve a liquid crystal display capable of reducing occurrence of quality problems and improving adhesive strength between substrates.

DESCRIPTION OF EMBODIMENTS

Figure 1:
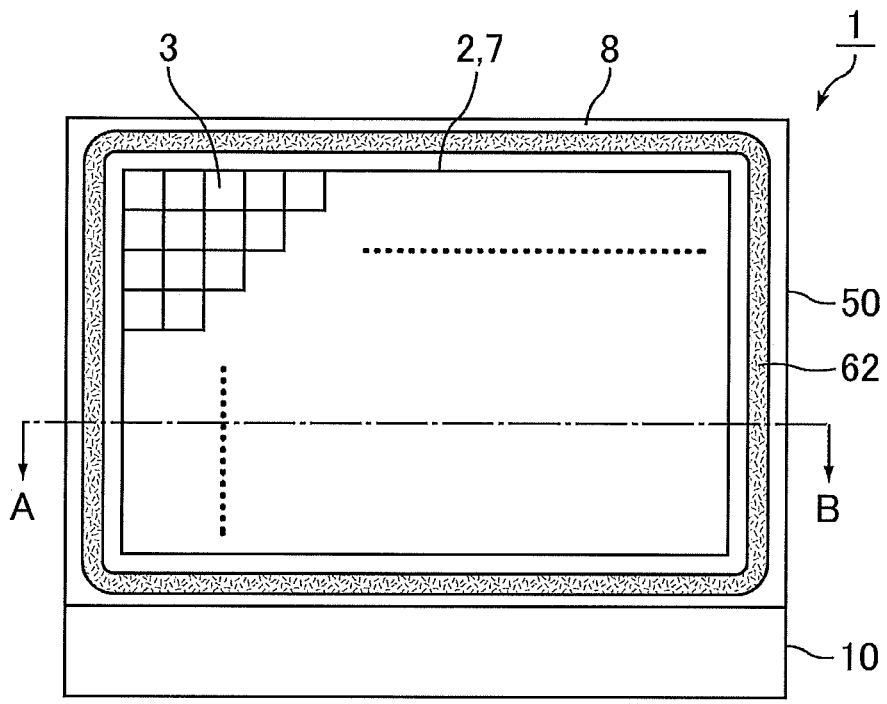
FIG. 1 is a schematic plan view of a liquid crystal panel included in a liquid crystal display according to Embodiment 1.

The present invention will be mentioned in more detail referring to the drawings in the following embodiments, but is not limited to these embodiments.

Embodiment 1

With reference to FIGS. 1 to 14, a liquid crystal display according to Embodiment 1 will be described. First, with reference to FIGS. 1 to 3, an entire structure of the liquid crystal display according to the present embodiment will be described.

The liquid crystal display according to the present embodiment is an active matrix drive and transmissive liquid crystal display. The liquid crystal display according to the present embodiment includes a liquid crystal panel 1, a backlight (not illustrated) arranged behind the liquid crystal panel 1, a control section (not illustrated) for driving and controlling the liquid crystal panel 1 and the backlight, and a flexible substrate (not illustrated) for connecting the liquid crystal panel 1 to the control section.

The liquid crystal panel 1 includes a display section 2 for displaying an image. A plurality of pixels 3 are arranged in a matrix in the display section 2. Each of the pixels 3 may include sub pixels of a plurality of colors (for example, three colors of red, green, and blue). In contrast, the liquid crystal display according to the present embodiment may be a monochrome liquid crystal display. In this case, it is not necessary to divide each pixel 3 into the plurality of sub pixels.

The liquid crystal panel 1 includes an array substrate (active matrix substrate) 10 corresponding to the above-described first substrate, an opposed substrate 50 corresponding to the above-described second substrate and facing the array substrate 10, a liquid crystal layer (display medium) 61 and a seal 62 provided between the substrates 10 and 50, an alignment film (not illustrated) provided on a surface on a liquid crystal layer 61 side of the array substrate 10, an alignment film (not illustrated) provided on a surface on a liquid crystal layer 61 side of the opposed substrate 50, and a source driver 5 mounted on the array substrate 10. In addition, the liquid crystal panel 1, the array substrate 10, and the opposed substrate 50 include a region (display region) 7 corresponding to the display section 2, and a region (picture-frame region) 8 around the display region 7. The source driver 5 is a drive circuit for source bus lines described later.

The seal 62 is formed in the picture-frame region 8 to surround the display region 7. In addition, the seal 62 bonds the substrates 10 and 50 together, and seals the liquid crystal layer 61 between the substrates 10 and 50.

The array substrate 10 is provided on a back side of the liquid crystal display, and the opposed substrate 50 is provided on an observer side. The array substrate 10 is irradiated with light from the backlight. An image displayed on the liquid crystal panel 1 is observed from an opposed substrate 50 side. A polarizing plate (not illustrated) is affixed on a surface of each of the substrates 10 and 50 on an opposite side of the liquid crystal layer 61. These polarizing plates are usually disposed in a cross-Nicol state with each other. The source driver 5 is mounted by a chip on glass (COG) technique in a region of the array substrate 10 that does not face the opposed substrate 50, that is, in a region protruded from the opposed substrate 50 (hereinafter referred to as an overhang region).

The array substrate 10 includes gate drivers 6a and 6b monolithically formed on the right and left of the display region 7, terminals 26, 27, 28, 29, and 30 formed in the overhang region, source bus lines (data signal lines) 12 provided to travel vertically through the display region 7, gate bus lines (scanning signal lines) 13 and common bus lines 17 provided to travel horizontally through the display region 7, lead-out wiring 18 and 19 each formed in the picture-frame region 8, wiring (hereinafter referred to as common trunk wiring) 16 formed in the picture-frame region 8 to surround the display region 7, and input wiring 25 formed in the picture-frame region 8. The gate bus lines 13 include the gate bus lines 13 connected to output terminals of the left gate driver 6a, and the gate bus lines 13 connected to output terminals of the right gate driver 6b. These two types of gate bus lines 13 are arranged alternately. The gate bus lines 13 correspond to the bus line in the above-described embodiment (D). The flexible substrate is mounted in a region (region surrounded by a thick alternate long and two short dashes line in FIG. 3) in which the terminals 26, 28, and 30 are provided. Each of the source bus lines 12 is connected to an output section of the source driver 5 via the corresponding lead-out wiring 18 and the terminal 27. Various signals and supply voltages are input into an input section of the source driver 5 from the control section via the flexible substrate, the terminal 28, the input wiring 25, and the terminal 29. A common signal is input into the common trunk wiring 16 from the control section via the flexible substrate and the terminal 30. Here, the common signal is a signal applied in common to all the pixels. The common bus lines 17 are connected to the common trunk wiring 16 in the picture-frame region 8. The common signal is applied to the common bus lines 17 from the common trunk wiring 16.

The gate drivers 6a and 6b are supplied with various signals and supply voltages from the control section via the flexible substrate, the terminal 26, and the lead-out wiring 19. Details will be described later. All the gate drivers called gate monolithic, gate driverless, gate driver incorporated in panel, gate in panel, gate-on array, and the like can be included in the gate drivers 6a and 6b. Instead of two gate drivers 6a and 6b, only one gate driver that performs a function similar to a function of the two gate drivers 6a and 6b may be provided.

Figure 2:
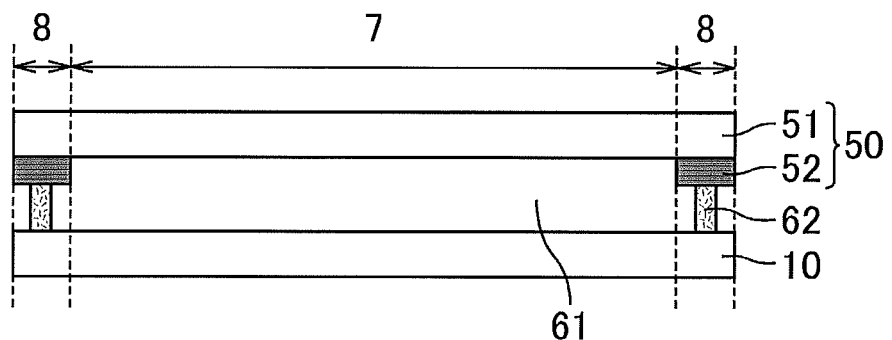
FIG. 2 is a schematic cross-sectional view taken along the line A-B of FIG. 1.
Figure 3:
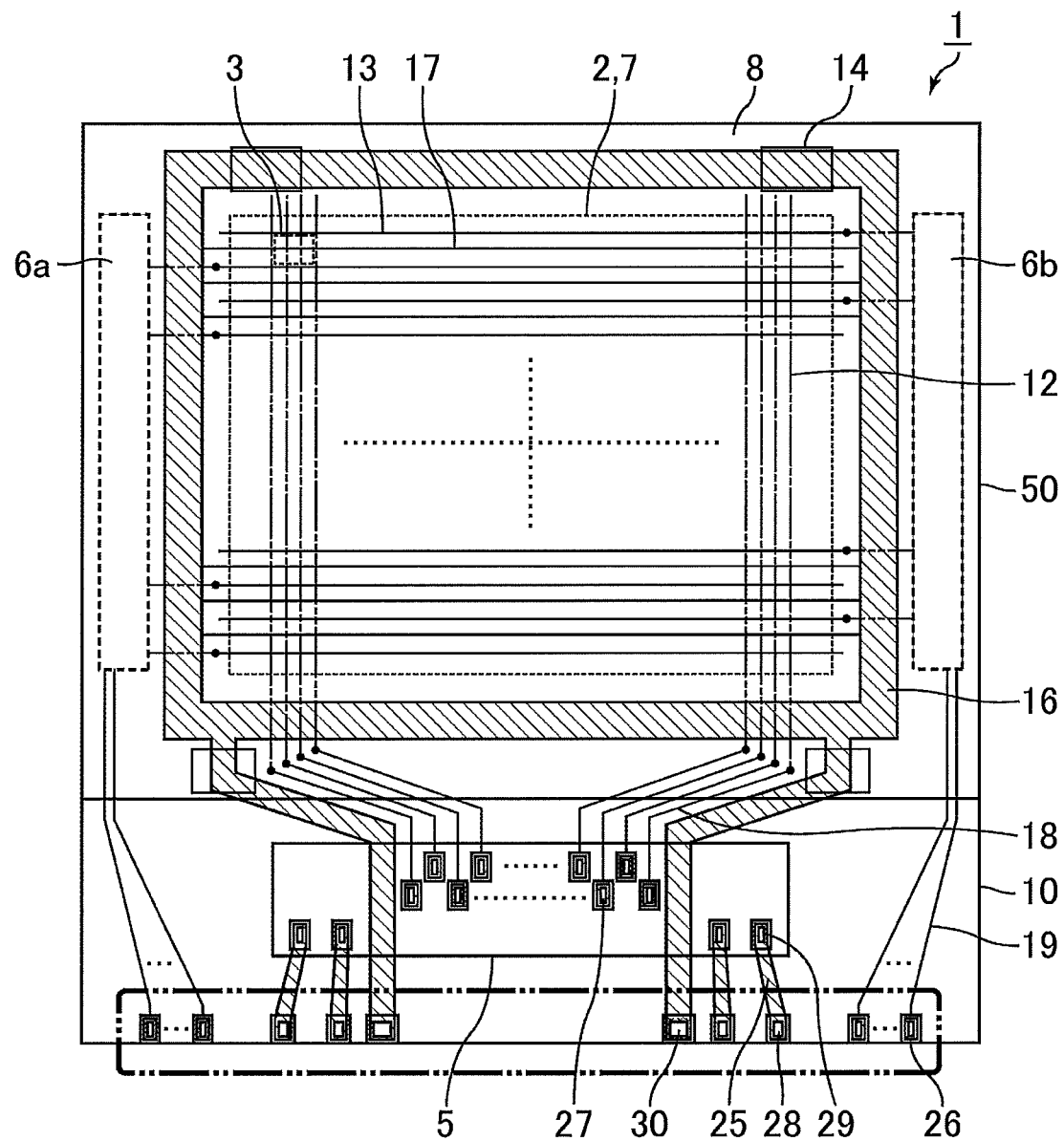
FIG. 3 is a schematic plan view of the liquid crystal panel included in the liquid crystal display according to Embodiment 1.

The opposed substrate 50 includes a transparent (translucent) insulating substrate 51, a black matrix (BM) 52 that functions as a light shielding member, and a plurality of columnar spacers (not illustrated). The BM 52 is formed to shield light in the picture-frame region 8 and a region facing bus lines. The BM 52 is formed in a frame shape and covers the gate drivers 6a and 6b. In FIG. 2, illustration of the BM 52 is omitted in the display region 7. In the display region 7, color filters of a plurality of colors may be provided. Each of the color filters is formed to cover a region defined by the BM 52, that is, an aperture of the BM 52. In addition, the opposed substrate 50 may have a transparent (light-transmissive) overcoat film that covers all the color filters. The columnar spacers are arranged in a light shielding region on the BM 52. In addition, particle-shaped spacers (not illustrated) may be mixed in the seal 62. These spacers are members for maintaining a constant distance between the array substrate 10 and the opposed substrate 50. The distance (cell gap) between both substrates is set to be about 4.0 μm.

Examples of materials of the color filter include an acrylic resin obtained by mixing pigments. Examples of materials of the BM 52 include chromium and an acrylic resin obtained by mixing black pigments. Preferably, the BM 52 is formed of an acrylic resin having a thickness of about 1.0 μm and obtained by mixing black pigments. The overcoat film is formed of a transparent insulating material. Specifically, a light-transmissive hardening resin, such as an acrylic resin and an epoxy resin, is used. The overcoat film is preferably formed of an acrylic resin, and has a thickness of preferably about 2.0 μm. The overcoat film has a function of protecting the color filter physically or chemically.

A liquid crystal mode of the liquid crystal display of the present embodiment is not particularly limited. For a liquid crystal mode using a vertical electric field such as a twisted nematic (TN) mode and a vertical alignment (VA) mode, the opposed substrate 50 has a common electrode to which the common signal is applied, the array substrate 10 has a common transfer electrode 14 connected to the common trunk wiring 16, and both electrodes are connected to each other via a conducting member. The common electrode is formed of a transparent conductive material (light-transmissive conductive material), such as an indium tin oxide (ITO), a tin oxide ($SnO_2$), and an indium zinc oxide (IZO). Preferably ITO is used. Examples of conducting members include a hardening resin in which conductive microparticles are mixed, silver, and carbon paste. Conductive microparticles may be mixed in a sealing material, and the microparticles may be used as a conductive member. Examples of conductive microparticles include microparticles made of resin with a metal, such as gold, being coated.

Next, with reference to FIGS. 4 to 8, a circuit configuration and operation of the liquid crystal display of the present embodiment will be described.

Figure 4:
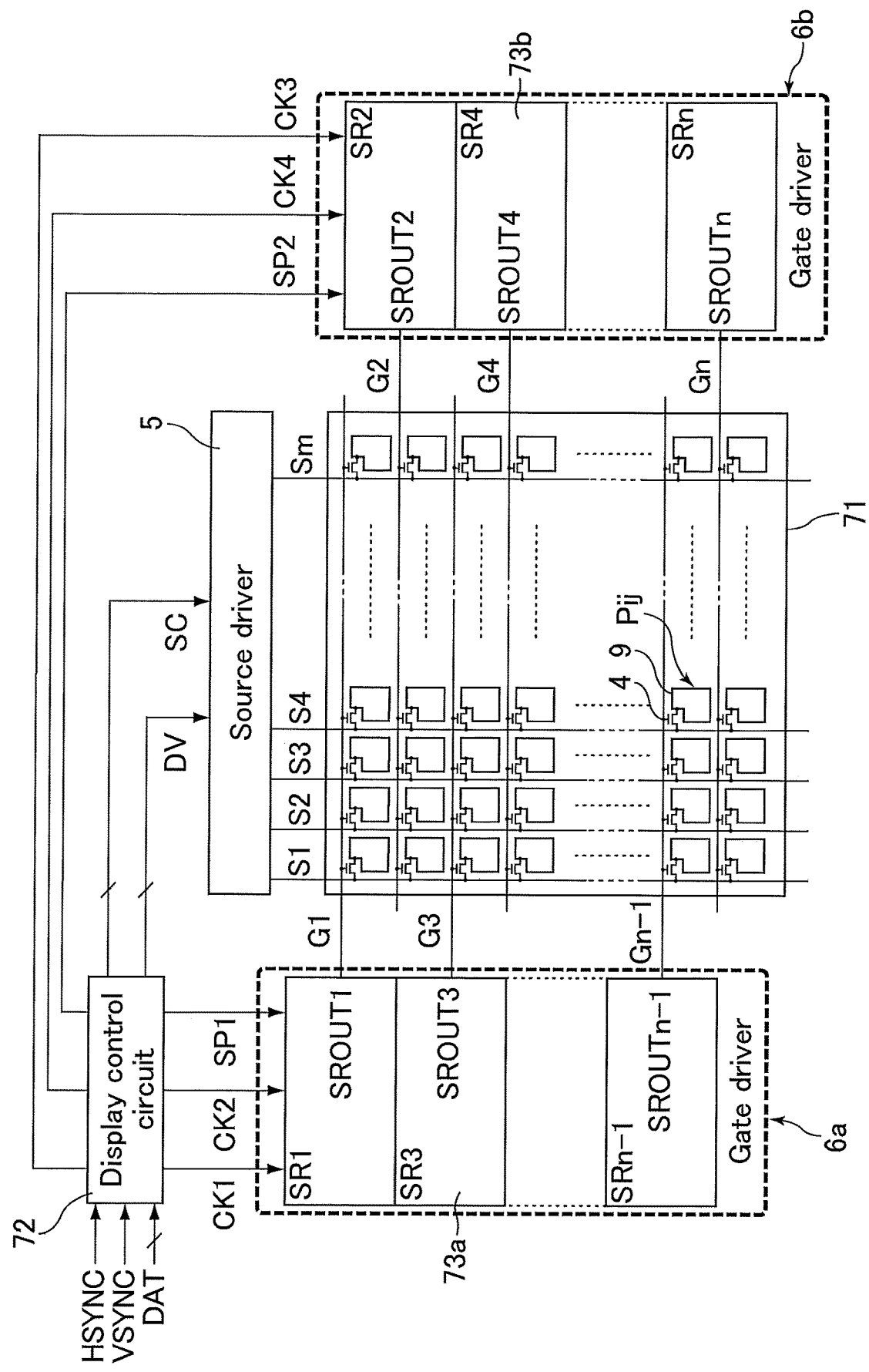
FIG. 4 is a block diagram illustrating a configuration of the liquid crystal display according to Embodiment 1.

As illustrated in FIG. 4, the liquid crystal display according to the present embodiment includes a pixel array 71, a display control circuit 72 provided in the control section, the source driver 5, and the gate drivers 6a and 6b.

The pixel array 71 includes n gate bus lines G1 to Gn corresponding to the gate bus lines 13, m source bus lines S1 to Sm corresponding to the source bus lines 12, and (m×n) pixel circuits Pij each formed in the pixel 3. n and m are each an integer greater than or equal to two, i is an integer from one to n inclusive, and j is an integer from one to m inclusive. The gate bus lines G1 to Gn are arranged parallel to each other, whereas the source bus lines S1 to Sm are arranged parallel to each other to be orthogonal to the gate bus lines G1 to Gn. Each of the pixel circuits Pij is arranged near an intersection of the gate bus line Gi and the source bus line Sj. In this way, (m×n) pixel circuits Pij are two-dimensionally arranged with m pieces in a row direction and n pieces in a column direction. The gate bus line Gi is connected in common to the pixel circuits Pij arranged in the ith row, whereas the source bus line Sj is connected in common to the pixel circuits Pij arranged in the jth column. Each of the pixel circuits Pij is provided with a pixel TFT 4 as a switching element and a pixel electrode 9. A gate of the TFT 4 is connected to the gate bus line Gi. Among a drain and source of the TFT 4, one is connected to the source bus line Sj, and the other is connected to the pixel electrode 9.

Control signals, such as a horizontal synchronization signal HSYNC and a vertical synchronizing signal VSYNC, and an image signal DAT are supplied from outside the liquid crystal display of the present embodiment. Based on these signals, the display control circuit 72 outputs clock signals CK1, CK2, and a start pulse SP1 to the gate driver 6a. The display control circuit 72 outputs clock signals CK3, CK4, and a start pulse SP2 to the gate driver 6b. The display control circuit 72 outputs a control signal SC and a digital video signal DV to the source driver 5.

The gate driver 6a includes a shift register 73a. The shift register 73a includes a plurality of multistage-connected unit circuits SR1, SR3, ..., SRn−1. The unit circuits SR1, SR3, ..., SRn−1 are connected to the odd-numbered gate bus lines G1, G3, ..., Gn−1, respectively.

The gate driver 6b includes a shift register 73b. The shift register 73b includes a plurality of multistage-connected unit circuits SR2, SR4, ..., SRn. The unit circuits SR2, SR4, ..., SRn are connected to the even-numbered gate bus lines G2, G4, ..., Gn, respectively.

The shift registers 73a and 73b control output signals SROUT1 to SROUTn to high-level (indicating a selected state) sequentially one-by-one. The output signals SROUT1 to SROUTn are provided to the gate bus lines G1 to Gn, respectively. This causes the gate bus lines G1 to Gn to be sequentially selected one-by-one, and the pixel circuits Pij in one row are collectively selected. That is, the pixel TFTs 4 of the pixel circuits Pij in one row are turned on.

Based on the control signal SC and the digital video signal DV, the source driver 5 applies voltages according to the digital video signal DV to the source bus lines S1 to Sm. This causes the voltages according to the digital video signal DV to be written in the pixel circuits Pij in the selected one row. Thus, the liquid crystal display of the present embodiment displays an image.

Figure 5:
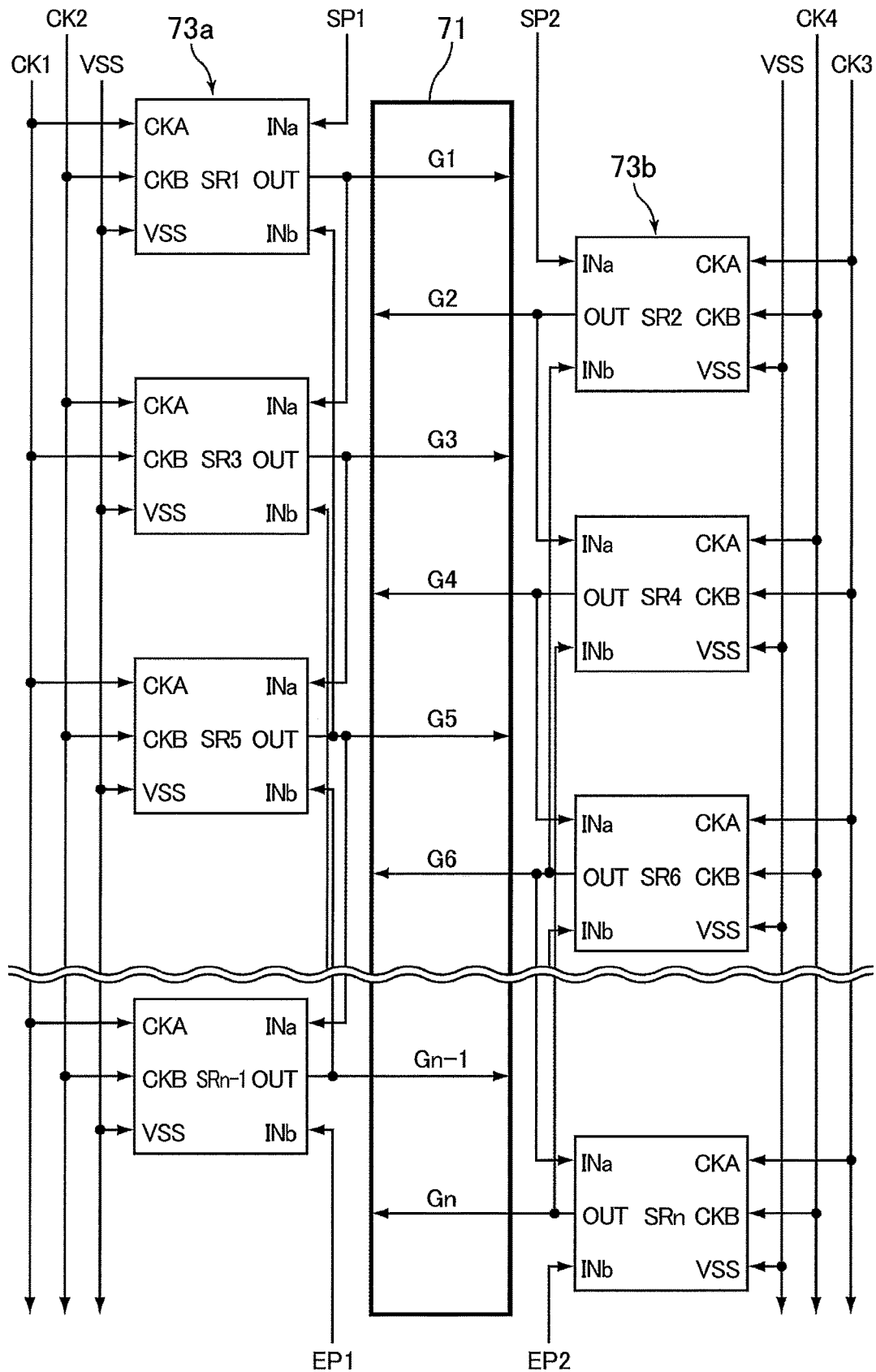
FIG. 5 is a block diagram illustrating a configuration of a shift register according to Embodiment 1.

As illustrated in FIG. 5, each of the unit circuits SR1 to SRn includes input terminals INa, INb, clock terminals CKA, CKB, a power terminal VSS, and an output terminal OUT.

The shift register 73a is supplied with the start pulse SP1, an end pulse EP1, the two-phase clock signals CK1, CK2, and a low-level potential VSS (a symbol identical to a symbol of the power terminal is assigned for convenience). The start pulse SP1 is input into the input terminal INa of the first-stage unit circuit SR1 in the shift register 73a. The end pulse EP1 is input into the input terminal INb of the final-stage unit circuit SRn−1 in the shift register 73a. The clock signal CK1 is input into the clock terminals CKA of odd-numbered-stage unit circuits in the shift register 73a and the clock terminals CKB of even-numbered-stage unit circuits in the shift register 73a. The clock signal CK2 is input into the clock terminals CKA of even-numbered-stage unit circuits in the shift register 73a and the clock terminals CKB of odd-numbered-stage unit circuits in the shift register 73a. The low-level potential VSS is input into the power terminals VSS of all the unit circuits in the shift register 73a. The output signals SROUT1, SROUT3, . . . , SROUTn−1 are output from the output terminals OUT of the unit circuits SR1, SR3, . . . , SRn−1, respectively. The output signals SROUT1, SROUT3, . . . , SROUTn−1 are output to the gate bus lines G1, G3, . . . , Gn−1, respectively. In addition, each output signal is input into the input terminal INa of the second-back-stage (first-back stage in the shift register 73a) unit circuit, and into the input terminal INb of the fourth-previous-stage (second-previous stage in the shift register 73a) unit circuit.

The shift register 73b is supplied with the start pulse SP2, an end pulse EP2, the two-phase clock signals CK3, CK4, and the low-level potential VSS. The start pulse SP2 is input into the input terminal INa of the first-stage unit circuit SR2 in the shift register 73b. The end pulse EP2 is input into the input terminal INb of the final-stage unit circuit SRn in the shift register 73b. The clock signal CK3 is input into the clock terminals CKA of odd-numbered-stage unit circuits in the shift register 73b and the clock terminals CKB of even-numbered-stage unit circuits in the shift register 73b. The clock signal CK4 is input into the clock terminals CKA of even-numbered-stage unit circuits in the shift register 73b and the clock terminals CKB of odd-numbered-stage unit circuits in the shift register 73b. The low-level potential VSS is input into the power terminals VSS of all the unit circuits in the shift register 73b. The output signals SROUT2, SROUT4, . . . , SROUTn are output from the output terminals OUT of the unit circuits SR2, SR4, . . . , SRn, respectively. The output signals SROUT2, SROUT4, . . . , SROUTn are output to the gate bus lines G2, G4, . . . , Gn, respectively. In addition, each output signal is input into the input terminal INa of the second-back-stage (first-back stage in the shift register 73b) unit circuit, and into the input terminal INb of the fourth-previous-stage (second-previous stage in the shift register 73b) unit circuit.

Although it is preferable that the low-level potential VSS is negative potential from a viewpoint of securely turning off an n-channel TFT, the low-level potential VSS may be positive potential when used for a p-channel TFT as the pixel TFT 4.

Figure 6:
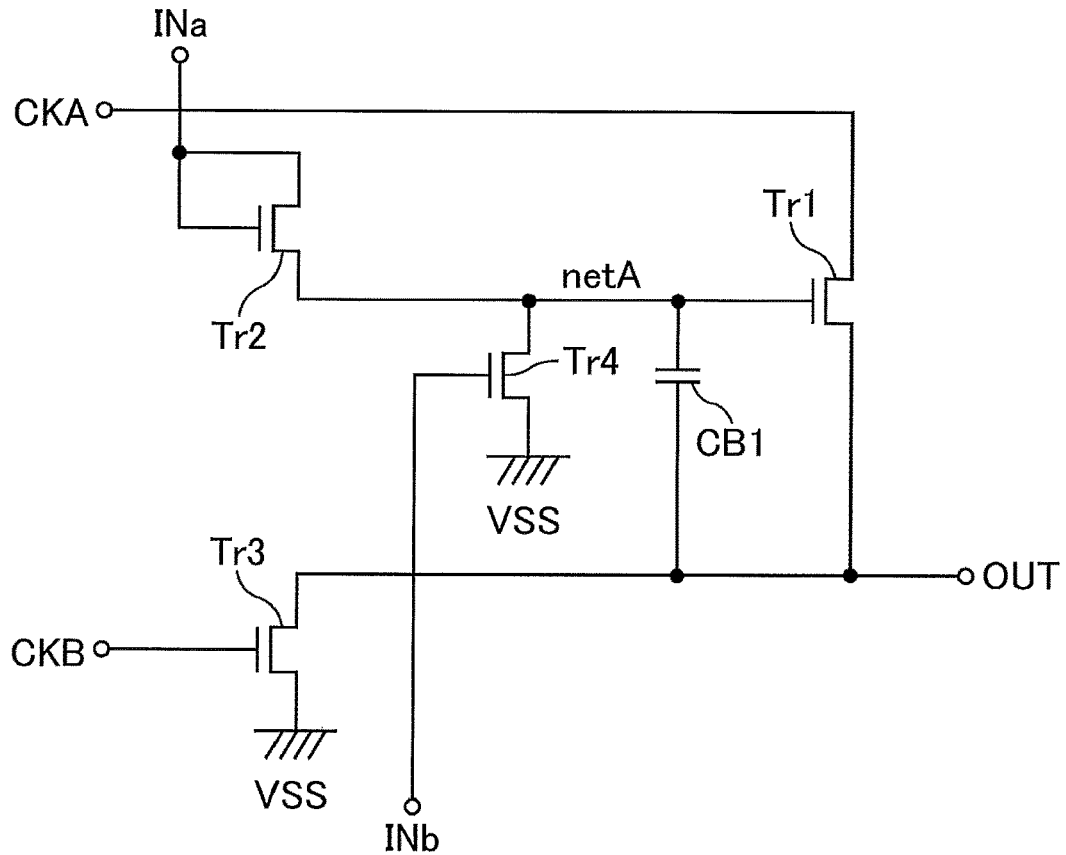
FIG. 6 is a circuit diagram of a unit circuit included in the shift register according to Embodiment 1.

As illustrated in FIG. 6, each unit circuit includes n-channel-TFT transistors Tr1 to Tr4, and a capacitor (hereinafter referred to as a bootstrap capacitor) CB1. Hereinafter, the transistor Tr1 is referred to as an output transistor Tr1.

A drain of the output transistor Tr1 is connected to the clock terminal CKA, and a source is connected to the output terminal OUT. A drain and gate of the transistor Tr2 are connected to the input terminal INa, and a source is connected to a gate of the output transistor Tr1. The bootstrap capacitor CB1 is provided between the gate and source of the output transistor Tr1. One terminal of the bootstrap capacitor CB1 is connected to the gate of the output transistor Tr1, and the other terminal is connected to the output terminal OUT. A drain of the transistor Tr3 is connected to the output terminal OUT, a gate is connected to the clock terminal CKB, and a source is connected to the power terminal VSS. A drain of the transistor Tr4 is connected to the gate of the output transistor Tr1, a gate is connected to the input terminal INb, and a source is connected to the power terminal VSS.

The output transistor Tr1 is provided between the clock terminal CKA and the output terminal OUT, and functions as a transistor (transmission gate) for switching whether to allow a clock signal to pass depending on gate potential. The gate of the output transistor Tr1 is capacitively coupled with a conducting terminal (source) on the output terminal OUT side. As a result, as will be described later, in a period when the output transistor Tr1 is on and the clock signal CK1 or CK3 that is input into the clock terminal CKA (hereinafter referred to as a clock signal CKA) is high-level, the gate potential of the output transistor Tr1 becomes higher than the high-level potential of the clock signal CKA. Hereinafter, anode to which the gate of the output transistor Tr1 is connected is referred to as netA.

Figure 7:
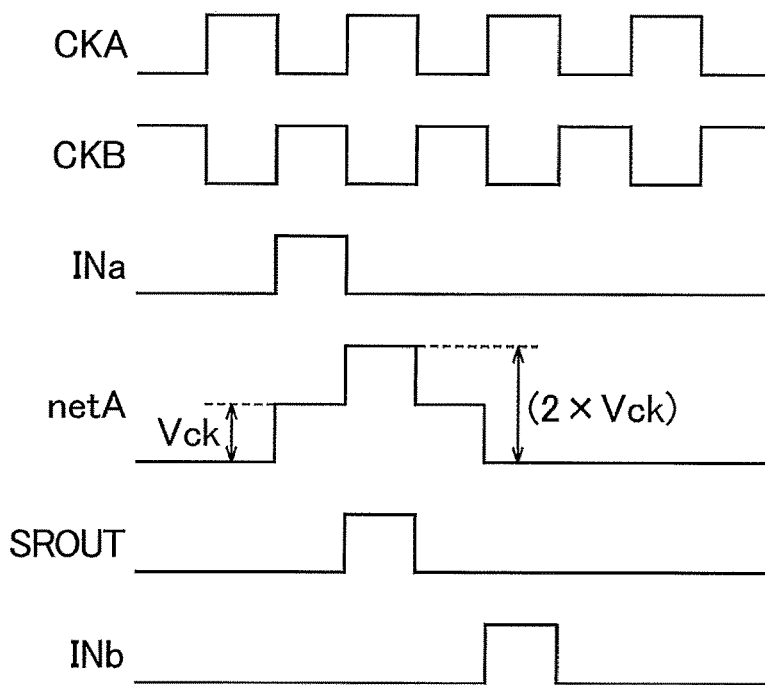
FIG. 7 illustrates a timing chart of the shift register according to Embodiment 1.
Figure 8:
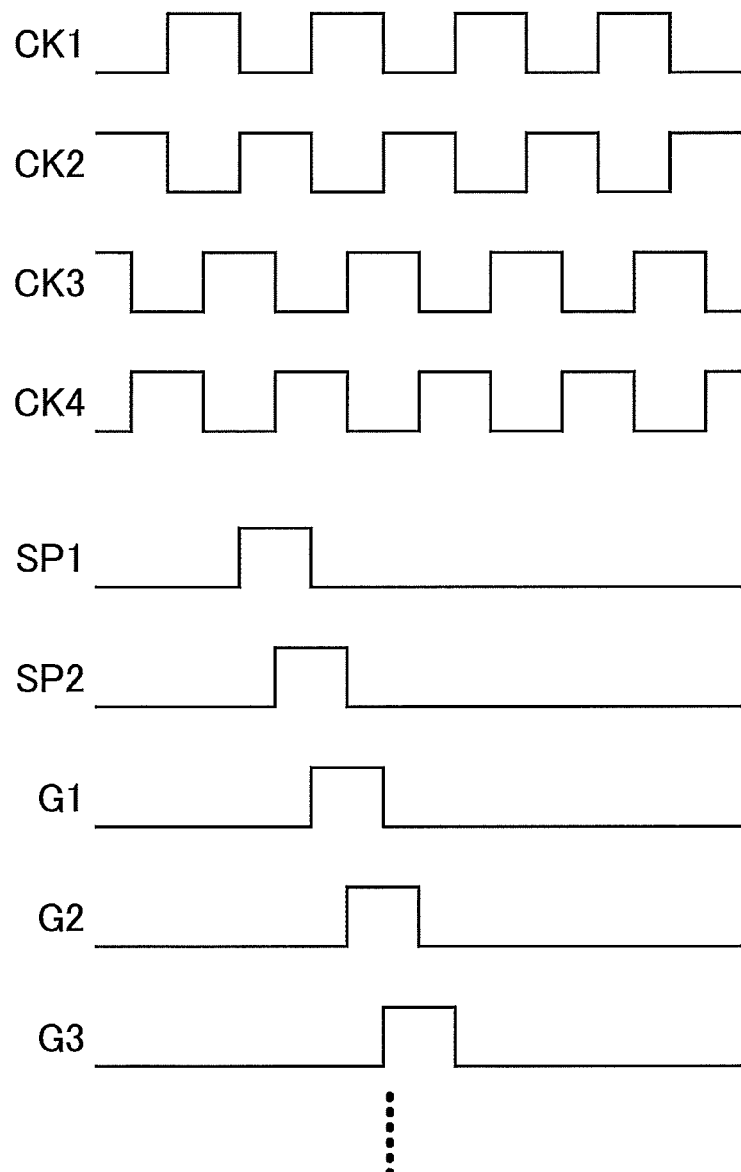
FIG. 8 illustrates a timing chart of the shift register according to Embodiment 1.

FIGS. 7 and 8 each illustrate a timing chart of the shift registers 73a and 73b. FIG. 7 illustrates input and output signals and voltage changes at the node netA of an odd-numbered-stage unit circuit in each shift register.

As illustrated in FIG. 7, in the odd-numbered-stage unit circuit in each shift register, the clock signal CK1 or CK3 is input via the clock terminal CKA, and the clock signal CK2 or CK4 is input via the clock terminal CKB. A period when potential of each of the clock signals CK1 to CK4 is high-level is substantially identical to ½ period. The clock signal CK2 is a signal obtained by delaying the clock signal CK1 by ½ period. The clock signal CK3 is a signal obtained by delaying the clock signal CK1 by ¼ period. The clock signal CK4 is a signal obtained by delaying the clock signal CK2 by ¼ period.

The start pulses SP1 and SP2 become high-level before a shifting operation starts for a period identical to a period of high-level potential of the clock signals CK2 and CK4, respectively. The end pulses EP1 and EP2 (not illustrated in FIGS. 7 and 8) become high-level after the shifting operation ends for a period identical to a period of high-level potential of the clock signals CK2 and CK4, respectively.

With reference to FIG. 7, an operation of the odd-numbered-stage unit circuit in each shift register will be described. First, when a signal (start pulses SP1, SP2, or an output signal of a second-previous-stage unit circuit (previous stage in each shift register), hereinafter referred to as an input signal INa) input into the input terminal INa changes from low-level to high-level, potential at the node netA also changes to high-level via the diode-connected transistor Tr2, and the output transistor Tr1 is turned on.

Next, when the input signal INa changes to low-level, the transistor Tr2 is turned off, and the node netA enters a floating state, but the output transistor Tr1 maintains on-state.

Next, when the clock signal CKA (clock signal CK1 or CK3) changes from low-level to high-level, the bootstrap capacitor CB1 is charged, and a bootstrap effect raises the potential at the node netA to about twice an amplitude Vck (=(high-level potential VGH)−(low-level potential VGL)) of the clock signal CKA. Since the gate potential of the output transistor Tr1 is sufficiently high, resistance between the source and drain of the output transistor Tr1 becomes smaller, and the clock signal CKA passes through the output transistor Tr1 without a voltage drop.

While the clock signal CKA is high-level, the potential at the node netA is about twice Vck, and the output signal SROUT is high-level.

Next, when the clock signal CKA changes to low-level, the potential at the node netA becomes high-level. At the same time, since the clock signal CK2 or CK4 input into the clock terminal CKB (hereinafter referred to as a clock signal CKB) changes to high-level, the transistor Tr3 is turned on, and low-level potential VSS is applied to the output terminal OUT. Consequently, the output signal SROUT becomes low-level.

Next, when a signal (end pulses EP1, EP2, or an output signal of a fourth-back-stage unit circuit (second-back stage in each shift register), hereinafter referred to as an input signal INb) input into the input terminal INb changes from low-level to high-level, the transistor Tr4 is turned on. When the transistor Tr4 is turned on, the low-level potential VSS is applied to the node netA, the potential at the node netA changes to low-level, and the output transistor Tr1 is turned off.

Next, when the input signal INb changes to low-level, the transistor Tr4 is turned off. At this time, the node netA enters a floating state, but the output transistor Tr1 maintains off-state. Until the input signal INa becomes high-level next time, ideally, the output transistor Tr1 maintains off-state, and the output signal SROUT maintains low-level.

Then, the transistor Tr3 is turned on when the clock signal CKB becomes high-level. Accordingly, every time the clock signal CKB becomes high-level, the low-level potential VSS is applied to the output terminal OUT. In this way, the transistor Tr3 has a function to repeatedly set the output terminal OUT to the low-level potential VSS and to stabilize the output signal SROUT.

The even-numbered-stage unit circuit also operates in the same manner as in the odd-numbered-stage unit circuit.

Consequently, as illustrated in FIG. 8, gate pulses are sequentially output to the gate bus lines G1, G2, G3, . . . .

Next, with reference to FIGS. 9 to 14, a configuration in the picture-frame region of the liquid crystal display according to the present embodiment will be described.

Figure 9:
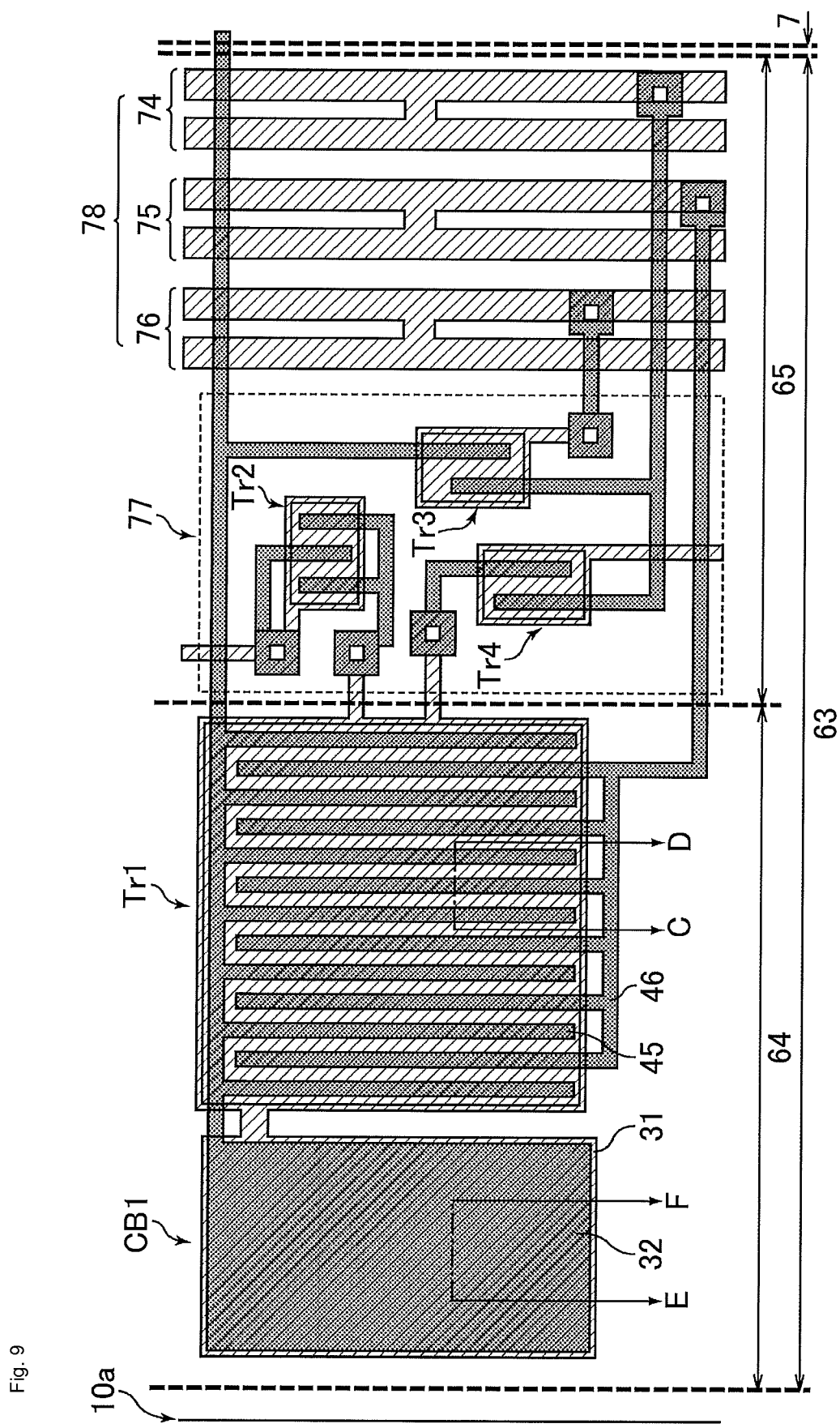
FIG. 9 is a schematic plan view illustrating a configuration in a picture-frame region of the liquid crystal display according to Embodiment 1.

As illustrated in FIG. 9, a wiring group 78 extending in a direction orthogonal to the above-described gate bus lines 13 is provided in each gate driver. The wiring group 78 includes wiring 74 that is set at the low-level potential VSS, wiring 75 for transmitting the clock signal CK1 or CK3, and wiring 76 for transmitting the clock signal CK2 or CK4. A slit aperture is formed in each piece of the wiring.

The output transistor Tr1 and the bootstrap capacitor CB1 are arranged adjacent to each other. The transistors Tr2 to Tr4 are arranged adjacent to each other. A region (hereinafter referred to as a control element region) 77 in which the transistors Tr2 to Tr4 are arranged is located between the wiring group 78 and the output transistor Tr1. The output transistor Tr1 and the bootstrap capacitor CB1 are arranged on an end 10a side (on an opposite side of the display region 7) of the control element region 77 and the wiring group 78.

Figure 10:
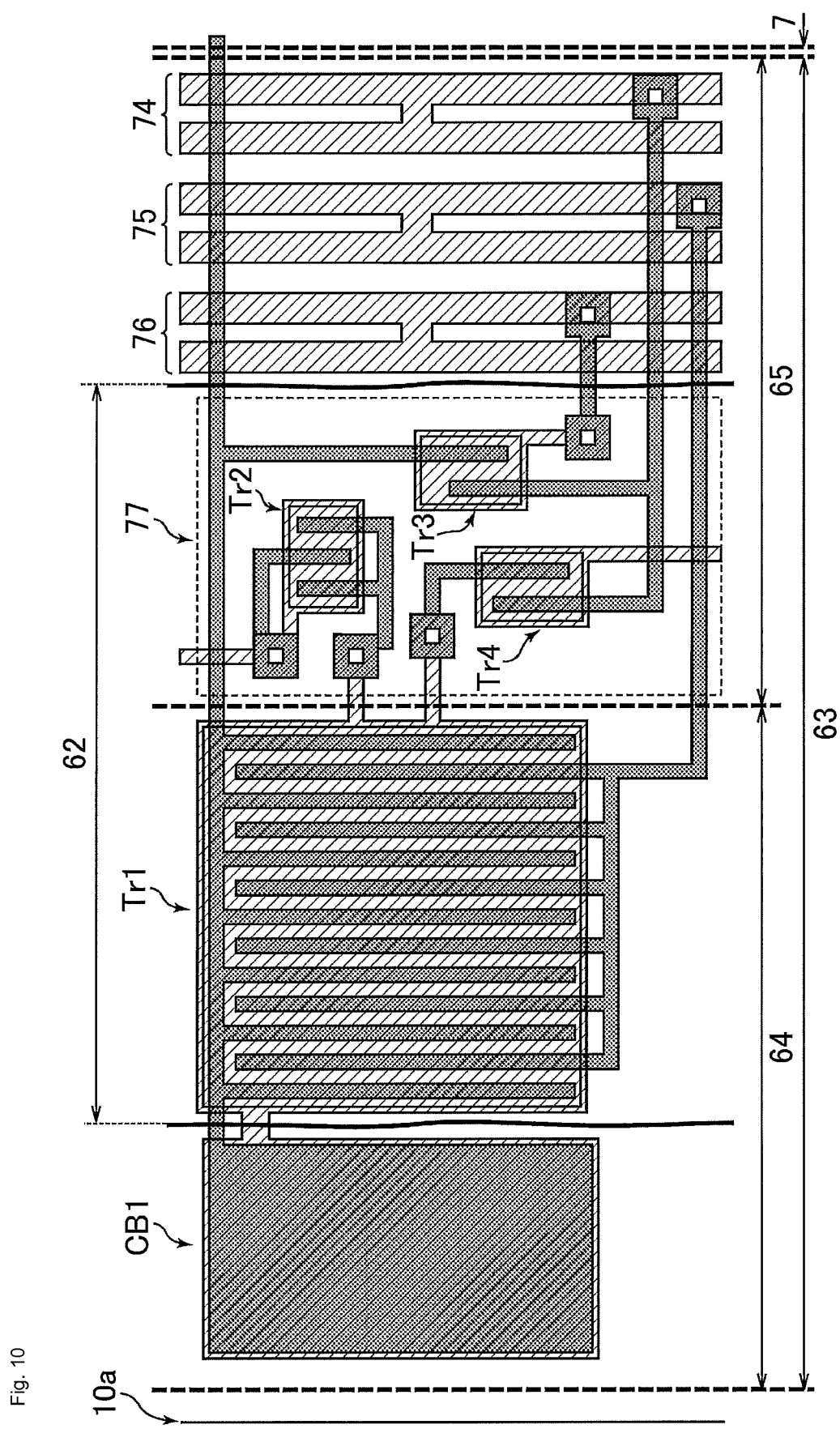
FIG. 10 is a schematic plan view illustrating the configuration in the picture-frame region of the liquid crystal display according to Embodiment 1.

As illustrated in FIG. 10, the array substrate 10 includes a strip region (hereinafter referred to as a seal-coating region) 63 sandwiched between thick dashed lines. The seal 62 is formed in a strip on the seal-coating region 63 so that the seal 62 does not protrude from the seal-coating region 63. One end of the seal-coating region 63 is set in a region between the bootstrap capacitor CB1 and the end 10a of the array substrate 10, whereas the other end is set in a region between the wiring 74 and the display region 7. The seal-coating region 63 includes a region 65 in which the transistors Tr2 to Tr4 and the wiring 74 to 76 (wiring group 78) are arranged, and a region 64 in which the output transistor Tr1 and the bootstrap capacitor CB1 are arranged. The region 65 corresponds to the above-described first region, and the region 64 corresponds to the above-described second region. In this way, in the present embodiment, different from Comparative Embodiment 1, the output transistor Tr1 and the bootstrap capacitor CB1 are arranged in the seal-coating region 63.

The seal 62 is arranged to cover at least part or all of the output transistor Tr1 and a partial region or entire region of the control element region 77. As long as the seal 62 does not protrude from the seal-coating region 63, it is not particularly limited whether the seal 62 covers regions other than these regions. For example, the seal 62 may be arranged to cover part or all of the output transistor Tr1, the entire region of the control element region 77, and part or all of the wiring 76. The seal 62 may be arranged to cover part or all of the bootstrap capacitor CB1, all of the output transistor Tr1, the entire region of the control element region 77, all of the wiring 76, and part or all of the wiring 75. The seal 62 may be arranged to cover part or all of the bootstrap capacitor CB1, all of the output transistor Tr1, the entire region of the control element region 77, all of the wiring 76, all of the wiring 75, and part or all of the wiring 74. In this way, the seal 62 includes a first portion that is adjacent to the liquid crystal layer 61 and a second portion that is adjacent to the first portion. The first portion is arranged on the region 65, whereas the second portion is arranged on the region 64.

Each of the transistors Tr1 to Tr4 is a bottom gate thin film transistor, and particularly the output transistor Tr1 is large and has a comblike source/drain structure. This enables each transistor to secure a large channel width, for example, on the order of ten μm to hundred mm.

Figure 11:
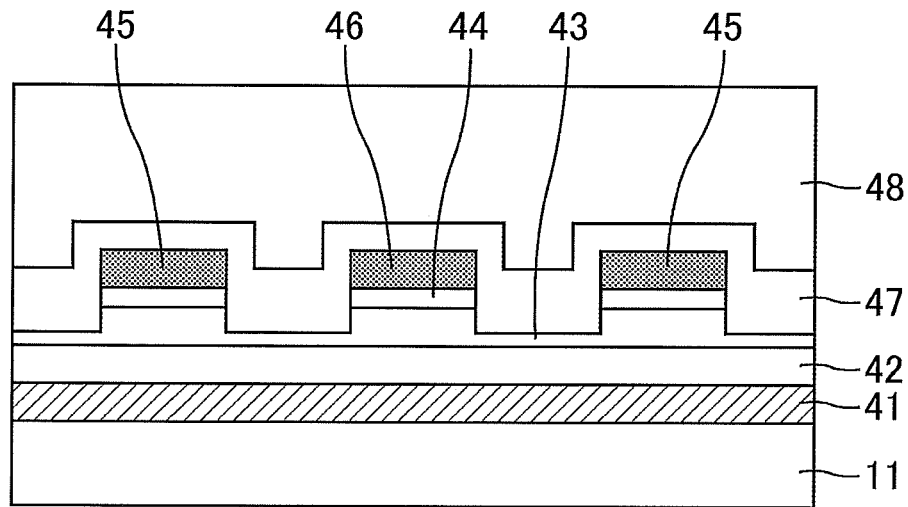
FIG. 11 is a schematic cross-sectional view taken along the line C-D of FIG. 9.

As illustrated in FIG. 11, the array substrate 10 includes a transparent (translucent) insulating substrate 11. The output transistor Tr1 includes a gate electrode 41 on the insulating substrate 11, a gate insulator 42 on the gate electrode 41, an i layer (semiconductor active layer) 43 on the gate insulator 42, an n+ layer 44 on the i layer 43, and a source electrode 45 and drain electrode 46 that are each provided on the n+ layer 44. The source electrode 45 and the drain electrode 46 each include a plurality of comblike portions. The source electrode 45 and the drain electrode 46 are arranged face to face so that the comblike portions mesh each other.

Figure 12:
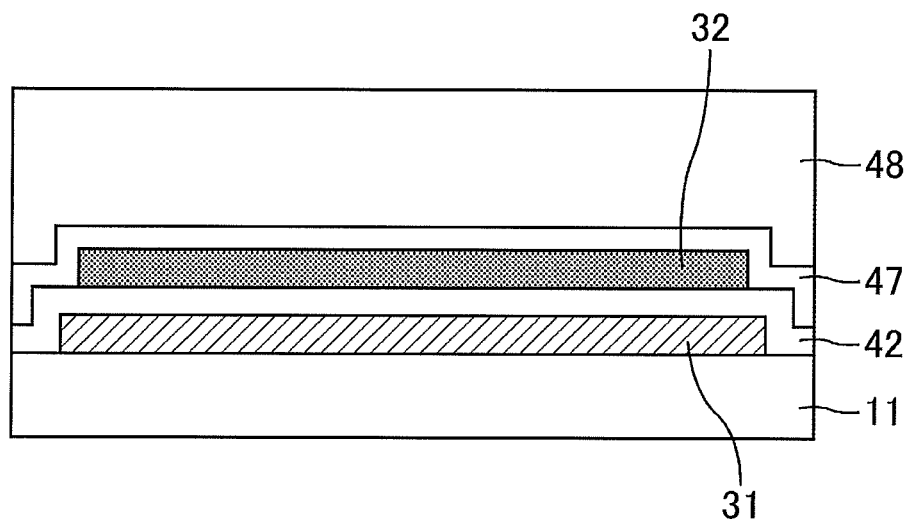
FIG. 12 is a schematic cross-sectional view taken along the line E-F of FIG. 9.

As illustrated in FIG. 12, the bootstrap capacitor CB1 includes a first electrode 31 on the insulating substrate 11, the gate insulator 42 that is provided on the first electrode 31 and shared by the output transistor Tr1, and a second electrode 32 on the gate insulator 42.

In order for the array substrate 10 and the opposed substrate 50 to be light-transmissive, as a material for the insulating substrates 11 and 51, inorganic substances, such as glass, silica glass, and silicon nitride, organic polymer compounds (resin), such as an acrylic resin, are mainly used. Preferably, silica glass with a thickness of about 0.7 mm is used.

The gate electrode 41 and the first electrode 31 are each formed of a common conductive film containing a material, such as molybdenum (Mo), titanium (Ti), aluminum (Al), copper (Cu), and an alloy of these metals. The gate electrode 41 and the first electrode 31 may be formed of a multilayer film of these conductive films. Preferably, Al is used. The gate insulator 42 is formed of a transparent (translucent) insulating layer containing an inorganic insulating material, such as silicon nitride and silicon oxide. The gate insulator 42 may be formed using a multilayer film of these insulating layers. The i layer (semiconductor active layer) 43 is formed of amorphous silicon, and the n+ layer 44 is formed of amorphous silicon containing impurities (for example, phosphorus). The source electrode 45, the drain electrode 46, and the second electrode 32 are each formed of a common conductive film containing a material, such as Mo, Ti, Al, Cu, and an alloy of these metals. The source electrode 45, the drain electrode 46, and the second electrode 32 may be each formed of a multilayer film of these conductive films.

A transparent (translucent) insulating layer 47 that functions as a passivation film is formed on the source electrode 45, the drain electrode 46, and the second electrode 32. The insulating layer 47 is formed of an inorganic insulating layer, such as a silicon nitride film and a silicon oxide film. The insulating layer 47 may be formed using a multilayer film of these inorganic insulating layers. A transparent (translucent) insulating layer 48 that functions as a planarization film is formed on the insulating layer 47. The insulating layer 48 is formed of an organic insulating layer. Examples of materials of the organic insulating layer include a photosensitive resin, such as a photosensitive acrylic resin.

Each of the transistors Tr2 to Tr4 differs from the output transistor Tr1 only in a planar structure, and has a cross-sectional structure similar to the structure of the output transistor Tr1. In each diagram, a shaded member, and the gate electrode 41 and the first electrode 31 are formed of a common conductive film, while a member with dot patterns, the source electrode 45, the drain electrode 46, and the second electrode 32 are formed of a common conductive film. In each diagram, a white-coated rectangular region arranged in a region in which the shaded member and the member with dot patterns overlap each other represents a contact hole for connecting both members to each other.

The pixel TFT 4 is a bottom gate thin film transistor in the same manner as in the output transistors Tr1 to Tr4, and is formed together with the output transistors Tr1 to Tr4 through a common process.

In the display region 7, the above-described pixel electrode 9 is formed on the insulating layer 48. The pixel electrode 9 is electrically connected to the drain electrode (not illustrated) of the pixel TFT 4 through a contact hole (not illustrated) that passes through the insulating layers 47 and 48. The pixel electrode 9 is formed of a transparent conductive material (light-transmissive conductive material), such as ITO, $SnO_2$, and IZO.

Next, a method for manufacturing the liquid crystal display of the present embodiment will be described. The liquid crystal display of the present embodiment can be manufactured by a general method. More particularly, first, a substrate (hereinafter referred to as an array mother glass) before being divided into a plurality of array substrates 10, and a substrate (referred to as a CF mother glass) before being divided into a plurality of opposed substrates 50 are each produced by a usual method.

Figure 13:
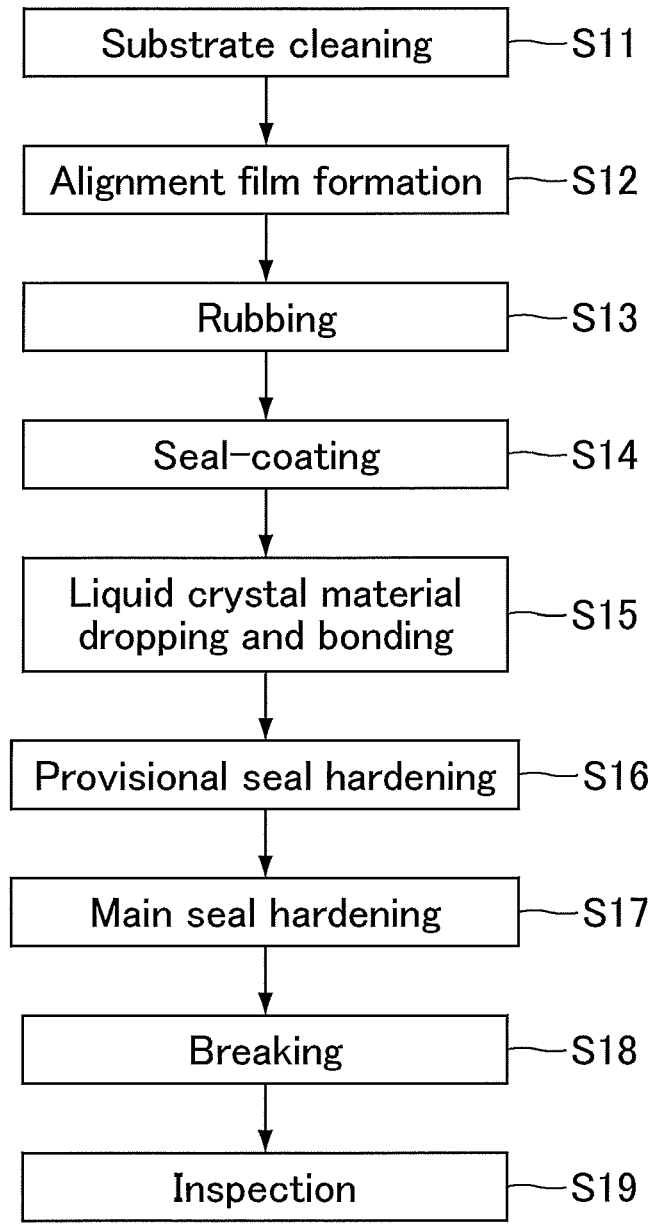
FIG. 13 is a diagram illustrating a manufacturing process of the liquid crystal display according to Embodiment 1.

After the array mother glass and the CF mother glass are produced, steps S11 to S19 are performed as illustrated in FIG. 13.

First, in step S11 (substrate cleaning process), the array mother glass and the CF mother glass are cleaned.

A degassing process may be performed between step S11 and step S12. In the degassing process, the array mother glass and the CF mother glass are heated to remove unnecessary substances, such as an organic solvent and gas from these mother glasses.

Next, in step S12 (alignment film formation process), an alignment film is formed on each of the array mother glass and the CF mother glass. Examples of materials for the alignment film include an organic material such as polyimide and an inorganic material such as a silicon oxide.

Next, in step S13 (rubbing process), rubbing treatment is applied to each alignment film. Step S13 may be omitted depending on an alignment state of liquid crystal molecules in the liquid crystal layer 61. Instead of the rubbing treatment, alignment treatment other than the rubbing treatment may be applied, for example, optical alignment treatment.

Next, in step S14 (seal-coating process), a material (hereinafter referred to as a sealing material) for a seal before hardening is coated on one of the array mother glass and the CF mother glass by a method such as a screen printing method and a dispenser writing method. The sealing material is pasty and is coated in a closed ring. This sealing material is a hardening (for example, ultraviolet-hardening) and thermo-hardening material (hereinafter referred to as light/heat combined use sealing material), and generally includes an acrylic resin and/or an epoxy resin. Specific examples of light/heat combined use sealing materials include the Photolec S series (made by SEKISUI CHEMICAL CO., LTD.) that uses an epoxy acrylic resin as a main component. The sealing material is preferably coated by a dispenser writing method.

Next, in step S15 (liquid crystal material dropping and bonding process), a liquid crystal material is dropped on a mother glass on which the sealing material is coated, a mother glass on which the sealing material is not coated, or both of the mother glasses, then both mother glasses are bonded together. Bonding of both mother glasses is performed under environments with pressures lower than atmospheric pressures (for example, under vacuum). Both mother glasses are placed under atmospheric pressures after bonding. The liquid crystal material is preferably dropped on the CF mother glass.

Next, in step S16 (provisional seal hardening process), the sealing material is irradiated with light from an array mother glass side to harden (provisional hardening) the sealing material to some extent. At this time, since the light is shielded by the output transistor Tr1 and the bootstrap capacitor CB1, the sealing material on the output transistor Tr1 and the bootstrap capacitor CB1 is irradiated with insufficient light, and the sealing material hardly undergoes provisional hardening. However, since the region 65 in which the transistors Tr2 to Tr4 and the wiring 74 to 76 are arranged includes many translucent regions, the sealing material can fully undergo provisional hardening on the region 65. In addition, a sealing material portion (portion corresponding to the above-described first portion) that has undergone provisional hardening is arranged closer to the display region 7, and a sealing material portion (portion corresponding to the above-described second portion) that has not undergone provisional hardening is arranged closer to the end 10a of the array substrate 10. This can prevent the sealing material portion that has not undergone provisional hardening from touching the liquid crystal layer, and thus can prevent a sealing material component from dissolving and diffusing into the liquid crystal layer. The sealing material is irradiated with light from the array substrate 10 side because the BM 52 is formed on the opposed substrate 50. Types of light used for irradiation is not limited, and may include, for example, light including ultraviolet light. Preferably, ultraviolet light is used.

Next, in step S17 (main seal hardening process), the bonded mother glasses are heated. The heating further hardens the sealing material (main hardening). All of the sealing material hardens in this process. Accordingly, on the region 64 in which the output transistor Tr1 and the bootstrap capacitor CB1 are arranged, the sealing material hardly undergoes provisional hardening in step S16, and undergoes main hardening in step S17. On the other hand, on the region 65 in which the transistors Tr2 to Tr4 and the wiring 74 to 76 are arranged, the sealing material undergoes provisional hardening in step S16, and undergoes main hardening in step S17.

In this way, in the present embodiment, the sealing material portion (portion corresponding to the above-described first portion) that undergoes provisional hardening and main hardening is arranged closer to the display region 7, while the sealing material portion (portion corresponding to the above-described second portion) that does not undergo provisional hardening and undergoes main hardening is arranged closer to the end 10a of the array substrate 10.

While the technique described in Patent Literature 11 needs to perform provisional hardening of the sealing material before bonding substrates together, the present embodiment performs provisional hardening of the sealing material after bonding mother glasses together. This can prevent foreign substances, such as dust, from mixing in the liquid crystal layer. Furthermore, the present embodiment does not need a mask for provisional hardening. This can reduce manufacturing costs.

While conditions for light irradiation and heat treatment in steps S16 and S17 can be suitably set in accordance with characteristics of the sealing material, when the Photolec S series is used, for example, ultraviolet irradiation of around 10 J is performed, and heat treatment at 120° C. is performed for 60 minutes.

Next, in step S18 (breaking process), the bonded mother glasses are broken along panel breaking lines into a plurality of liquid crystal cells.

Next, in step S19 (inspection process), inspections such as a lighting inspection of the liquid crystal cell are performed to check quality conditions of the liquid crystal cell.

Subsequently, after the polarizing plate and phase plate (optional) are affixed on each of both surfaces of the liquid crystal cell, the source driver 5 is mounted and the liquid crystal panel 1 is completed. Then, the flexible substrate is connected to the liquid crystal panel 1, the control section and the backlight unit are attached, and these components are accommodated in an enclosure, thereby completing the liquid crystal display of Embodiment 1.

In the present embodiment, the output transistor Tr1 and the bootstrap capacitor CB1 are arranged in a region between the end 10a of the array substrate 10 and the control element region 77. Accordingly, each of the transistors in the control element region 77 and the wiring group 78 can be arranged on a display region 7 side of the output transistor Tr1 and the bootstrap capacitor CB1. In addition, it is possible to perform provisional hardening and main hardening of the sealing material on the region 65 in which the transistors Tr2 to Tr4 and the wiring 74 to 76 are arranged. On the other hand, it is possible to perform main hardening of the sealing material on the region 64 in which the output transistor Tr1 and the bootstrap capacitor CB1 are arranged. Consequently, it is possible to control the sealing material component from dissolving in the liquid crystal layer by the time of completion of the main seal hardening process. In addition, it is possible to define the seal-coating region 63 to be wider. Furthermore, it is possible to control occurrence of liquid crystal leakage. Therefore, it is possible to reduce occurrence of quality problems and to improve adhesive strength between substrates.

Figure 14:
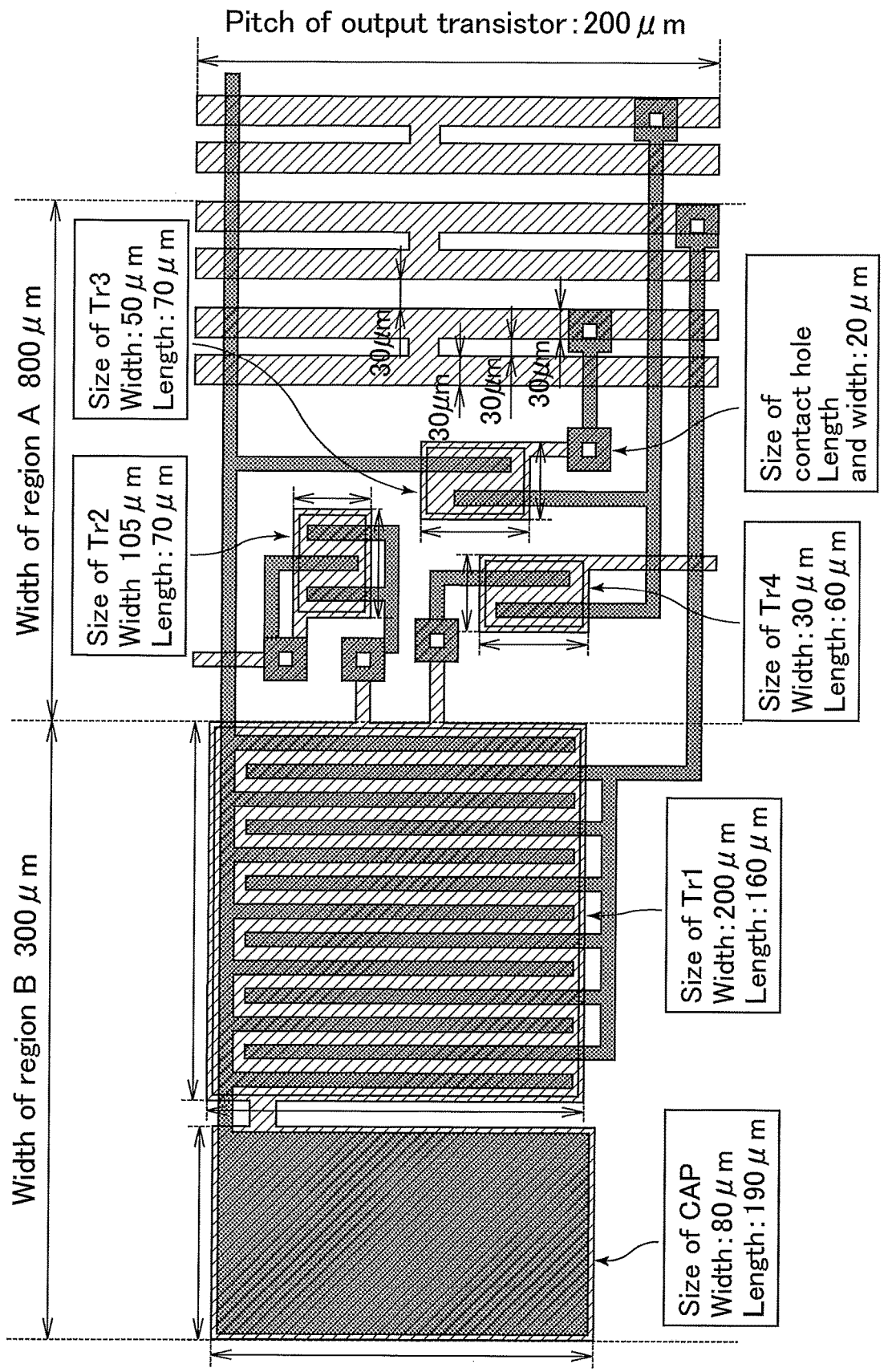
FIG. 14 is a schematic plan view illustrating the configuration in the picture-frame region of the liquid crystal display according to Embodiment 1.

Although a size of each element and a thickness of each piece of wiring are not particularly limited and can be suitably configured, for example, values illustrated in FIG. 14 can be applied. A thickness of the wiring 74 and a thickness of the wiring 75 are substantially identical to a thickness of the wiring 76. Spacing of the wiring 74 and the wiring 75 can be set to 30 μm. A pitch of the output transistor is substantially equal to a pitch of the unit circuit or the gate bus line. Furthermore, a width of wiring that connects between elements or between an element and wiring can be set to, for example, 10 μm.

In the case illustrated in FIG. 14, a proportion of an area in which light is shielded in a region A including the transistors Tr2 to Tr4, the wiring 76, and the wiring 75 is roughly estimated to be about 25% (=(105×70+50×70+30× 60+20×20×6×six contacts+30×200×four linear parts of wiring)/(800×200)=39050/160000). On the other hand, a proportion of an area in which light is shielded in a region B including the output transistor Tr1 and the bootstrap capacitor CB1 is roughly estimated to be about 80% (=(80×190+ 200×160)/(300×200)=47200/600). In this way, the proportion of the area in which light is shielded in the region A is preferably 50% or smaller, and the proportion of the area in which light is shielded in the region B is preferably larger than 50%.

Embodiment 2

Although a liquid crystal display according to Embodiment 2 has different layout of an element and wiring in a shift register, the liquid crystal display according to Embodiment 2 is substantially identical to a liquid crystal display of Embodiment 1 except for a difference.

Figure 15:
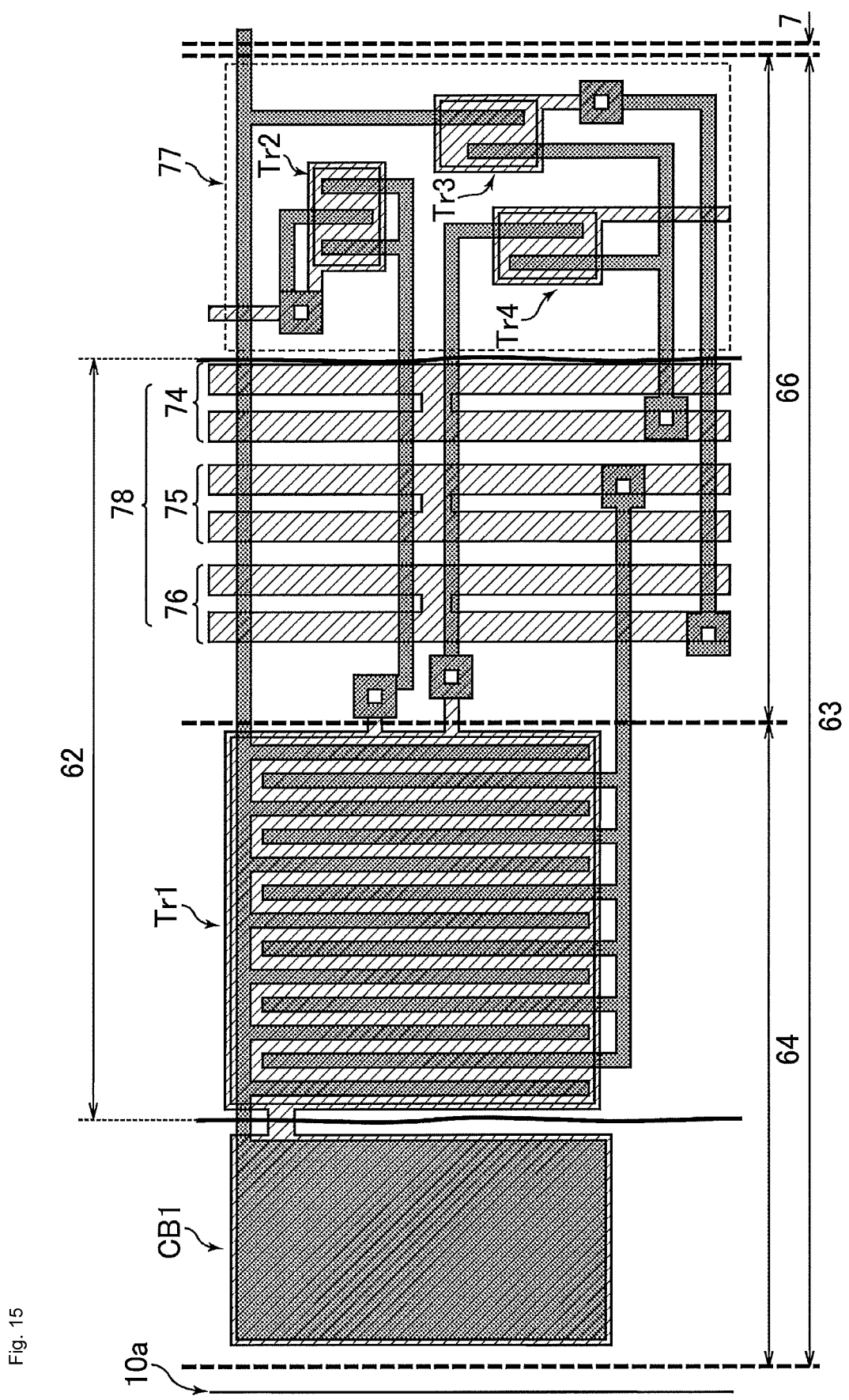
FIG. 15 is a schematic plan view illustrating the configuration in the picture-frame region of the liquid crystal display according to Embodiment 2.

In Embodiment 1, a wiring group 78 is arranged in a region between transistors Tr2 to Tr4 (control element region 77) and a display region 7. On the other hand, in the present embodiment, as illustrated in FIG. 15, the transistors Tr2 to Tr4 (control element region 77) are arranged in a region between the wiring group 78 and the display region 7. Embodiments 1 and 2 have a common feature in that the wiring group 78 and the transistors Tr2 to Tr4 (control element region 77) are arranged in a region between the display region 7 and an output transistor Tr1.

An array substrate 10 includes a strip region (hereinafter referred to as a seal-coating region) 63 sandwiched between thick dashed lines, and a seal 62 is formed in a strip on the seal-coating region 63 not to protrude from the seal-coating region 63. One end of the seal-coating region 63 is set in a region between a bootstrap capacitor CB1 and an end 10a of the array substrate 10, whereas the other end is set in a region between the transistors Tr2 to Tr4 (control element region 77) and the display region 7. The seal-coating region 63 includes a region 64 in which the output transistor Tr1 and the bootstrap capacitor CB1 are arranged, and a region 66 in which the transistors Tr2 to Tr4 (control element region 77) and wiring 74 to 76 (wiring group 78) are arranged. The region 66 corresponds to the above-described first region, and the region 64 corresponds to the above-described second region. In this way, in the present embodiment, different from Comparative Embodiment 1, the output transistor Tr1 and the bootstrap capacitor CB1 are arranged in the seal-coating region 63.

The seal 62 is arranged to cover at least part or all of the output transistor Tr1 and part or all of the wiring group 78. As long as the seal 62 does not protrude from the seal-coating region 63, it is not particularly limited whether the seal 62 covers regions other than these regions. For example, the seal 62 may be arranged to cover all of the output transistor Tr1, all of the wiring group 78, and a partial region or entire region of the control element region 77. The seal 62 may be arranged to cover part or all of the bootstrap capacitor CB1, all of the output transistor Tr1, all of the wiring group 78, and a partial region or entire region of the control element region 77. In this way, the seal 62 includes a first portion that is adjacent to a liquid crystal layer 61 and a second portion that is adjacent to the first portion. The first portion is arranged on the region 66, and the second portion is arranged on the region 64.

In the present embodiment, in the same manner as in Embodiment 1, the output transistor Tr1 and the bootstrap capacitor CB1 are arranged in a region between the end 10a of the array substrate 10 and the control element region 77. Therefore, also in the present embodiment, it is possible to reduce occurrence of quality problems and to improve adhesive strength between substrates.

In each of Embodiments 1 and 2, arrangement places of the output transistor Tr1 and the bootstrap capacitor CB1 may be transposed.

Embodiment 3

A liquid crystal display according to Embodiment 3 is substantially identical to a liquid crystal display of Embodiment 1 except for a layout of an element and wiring in a shift register being different.

Figure 16:
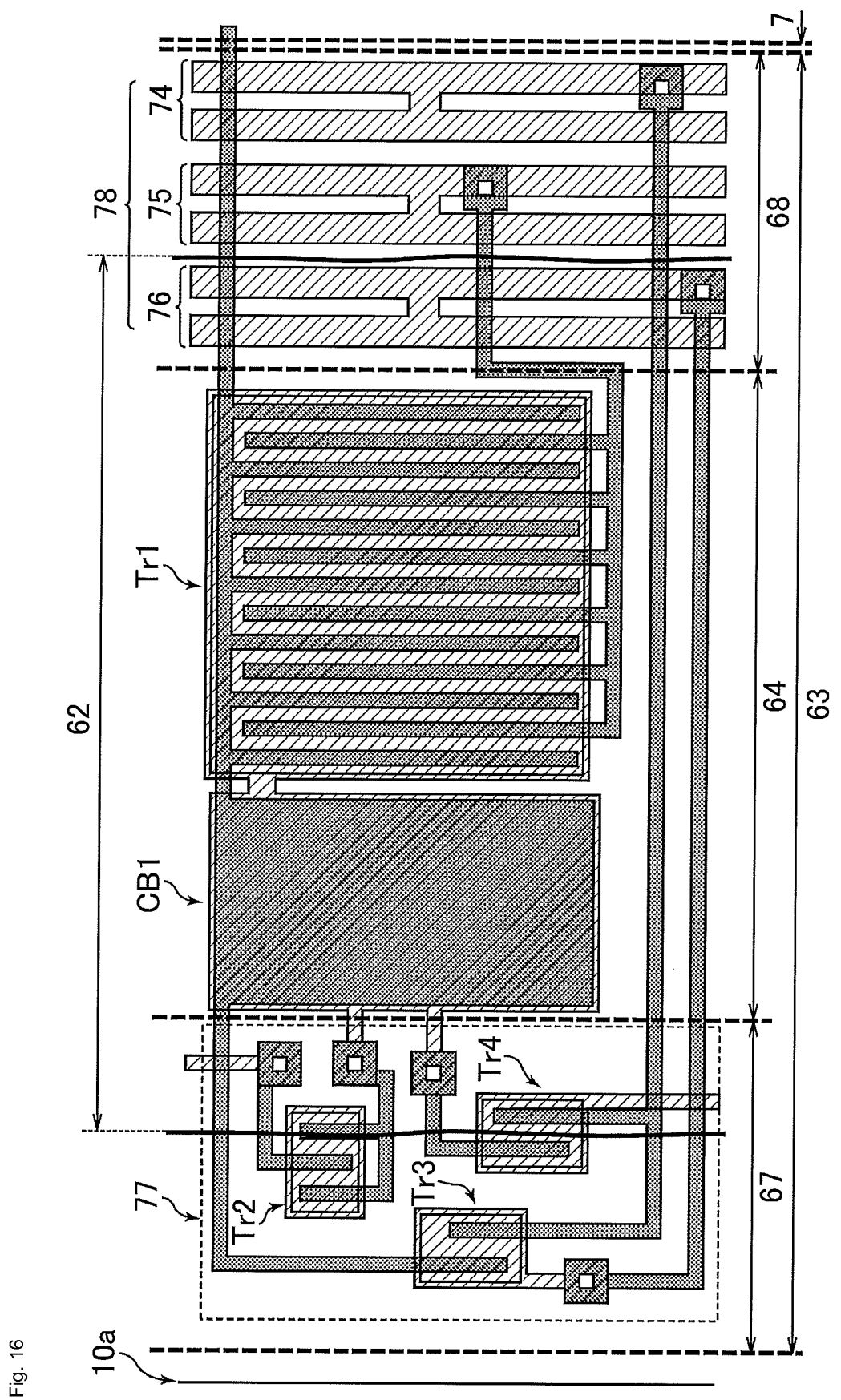
FIG. 16 is a schematic plan view illustrating the configuration in the picture-frame region of the liquid crystal display according to Embodiment 3.

In the present embodiment, as illustrated in FIG. 16, transistors Tr2 to Tr4 (control element region 77) are arranged in a region between an end 10a of an array substrate 10 and a bootstrap capacitor CB1.

The array substrate 10 includes a strip region (hereinafter referred to as a seal-coating region) 63 sandwiched between thick dashed lines, and a seal 62 is formed in a strip on the seal-coating region 63 not to protrude from the seal-coating region 63. One end of the seal-coating region 63 is set in a region between the control element region 77 and the end 10a of the array substrate 10, whereas the other end is set in a region between wiring 74 and a display region 7. The seal-coating region 63 includes a region 64 in which an output transistor Tr1 and the bootstrap capacitor CB1 are arranged, a region 67 in which the transistors Tr2 to Tr4 are arranged, and a region 68 in which wiring 74 to 76 (wiring group 78) are arranged. The region 68 corresponds to the above-described first region, and the region 64 corresponds to the above-described second region. In this way, in the present embodiment, different from Comparative Embodiment 1, the output transistor Tr1 and the bootstrap capacitor CB1 are arranged in the seal-coating region 63.

The seal 62 is arranged to cover at least part or all of the output transistor Tr1 and part or all of the wiring 76. As long as the seal 62 does not protrude from the seal-coating region 63, it is not particularly limited whether the seal 62 covers regions other than these regions. For example, the seal 62 may be arranged to cover part or all of the bootstrap capacitor CB1, all of the output transistor Tr1, and all of the wiring 76. The seal 62 may be arranged to cover a partial region or entire region of the control element region 77, all of the bootstrap capacitor CB1, all of the output transistor Tr1, all of the wiring 76, and part or all of wiring 75. The seal 62 may be arranged to cover a partial region or entire region of the control element region 77, all of the bootstrap capacitor CB1, all of the output transistor Tr1, all of the wiring 76, all of the wiring 75, and part or all of the wiring 74. In this way, the seal 62 includes a first portion that is adjacent to a liquid crystal layer 61 and a second portion that is adjacent to the first portion. The first portion is arranged on the region 68, and the second portion is arranged on the region 64.

In the present embodiment, the output transistor Tr1 and the bootstrap capacitor CB1 are arranged in a region between the end 10a of the array substrate 10 and the wiring 76. Accordingly, the wiring group 78 can be arranged on a display region 7 side of the output transistor Tr1 and the bootstrap capacitor CB1. In addition, it is possible to perform provisional hardening and main hardening of a sealing material on the region 68 in which the wiring 74 to 76 are arranged. On the other hand, it is possible to perform main hardening of the sealing material on the region 64 in which the output transistor Tr1 and the bootstrap capacitor CB1 are arranged. Consequently, it is possible to control the sealing material component from dissolving in the liquid crystal layer by the time of completion of the main seal hardening process. In addition, it is possible to define the seal-coating region 63 to be wider. Furthermore, it is possible to control occurrence of liquid crystal leakage. Therefore, in the same manner as in Embodiment 1, it is possible to reduce occurrence of quality problems and to improve adhesive strength between substrates.

However, the present embodiment differs from Embodiment 1 in that the sealing material portion that undergoes provisional hardening and main hardening is separately arranged.

Embodiment 4

A liquid crystal display according to Embodiment 4 is substantially identical to a liquid crystal display of Embodiment 3 except for a layout of an element and wiring in a shift register being different.

Figure 17:
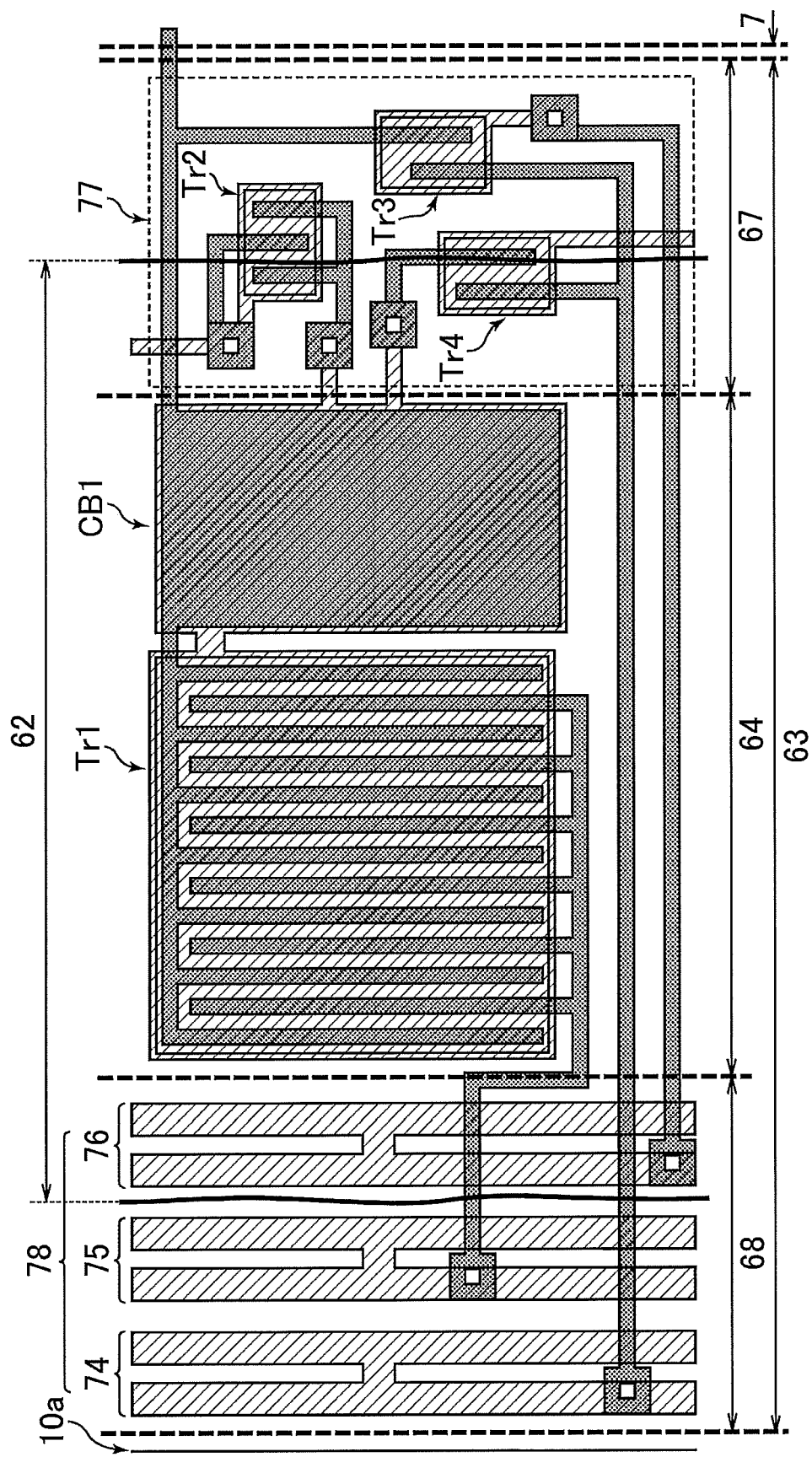
FIG. 17 is a schematic plan view illustrating the configuration in the picture-frame region of the liquid crystal display according to Embodiment 4.

In Embodiment 3, transistors Tr2 to Tr4 (control element region 77) are arranged in a region between an end 10a of an array substrate 10 and a bootstrap capacitor CB1. On the other hand, in the present embodiment, as illustrated in FIG. 17, a wiring group 78 is arranged in a region between the end 10a of the array substrate 10 and an output transistor Tr1. Embodiments 3 and 4 have a common feature in that the output transistor Tr1 and the bootstrap capacitor CB1 are arranged in a region between the wiring group 78 and the transistors Tr2 to Tr4 (control element region 77).

The array substrate 10 includes a strip region (hereinafter referred to as a seal-coating region) 63 sandwiched between thick dashed lines, and a seal 62 is formed in a strip on the seal-coating region 63 not to protrude from the seal-coating region 63. One end of the seal-coating region 63 is set between wiring 74 and the end 10a, whereas the other end is set in a region between the transistors Tr2 to Tr4 (control element region 77) and a display region 7. The seal-coating region 63 includes a region 64 in which the output transistor Tr1 and the bootstrap capacitor CB1 are arranged, a region 67 in which the transistors Tr2 to Tr4 are arranged, and a region 68 in which wiring 74 to 76 (wiring group 78) are arranged. The region 67 corresponds to the above-described first region, and the region 64 corresponds to the above-described second region. In this way, in the present embodiment, different from Comparative Embodiment 1, the output transistor Tr1 and the bootstrap capacitor CB1 are arranged in the seal-coating region 63.

The seal 62 is arranged to cover at least part or all of the bootstrap capacitor CB1, and a partial region or entire region of the control element region 77. As long as the seal 62 does not protrude from the seal-coating region 63, it is not particularly limited whether the seal 62 covers regions other than these regions. For example, the seal 62 may be arranged to cover part or all of the output transistor Tr1, all of the bootstrap capacitor CB1, and a partial region or entire region of the control element region 77. The seal 62 may be arranged to cover part or all of the wiring 76, all of the output transistor Tr1, all of the bootstrap capacitor CB1, and a partial region or entire region of the control element region 77. The seal 62 may be arranged to cover part or all of the wiring 75, all of the wiring 76, all of the output transistor Tr1, all of the bootstrap capacitor CB1, and a partial region or entire region of the control element region 77. The seal 62 may be arranged to cover part or all of the wiring 74, all of the wiring 75, all of the wiring 76, all of the output transistor Tr1, all of the bootstrap capacitor CB1, and a partial region or entire region of the control element region 77. In this way, the seal 62 includes a first portion that is adjacent to a liquid crystal layer 61 and a second portion that is adjacent to the first portion. The first portion is arranged on the region 67, and the second portion is arranged on the region 64.

In the present embodiment, in the same manner as in Embodiment 1, the output transistor Tr1 and the bootstrap capacitor CB1 are arranged in a region between the end 10a of the array substrate 10 and the control element region 77. Therefore, also in the present embodiment, it is possible to reduce occurrence of quality problems and to improve adhesive strength between substrates.

The wiring group 78 is arranged in a region between the end 10a of the array substrate 10 and the output transistor Tr1. Accordingly, it is possible to protect the transistors Tr1 to Tr4 from static electricity that intrudes from outside by the wiring group 78.

In each of Embodiments 3 and 4, arrangement places of the output transistor Tr1 and the bootstrap capacitor CB1 may be transposed.

Embodiment 5

A liquid crystal display according to Embodiment 5 is substantially identical to a liquid crystal display of Embodiment 1 except for a layout of an element and wiring in a shift register being different.

Figure 18:
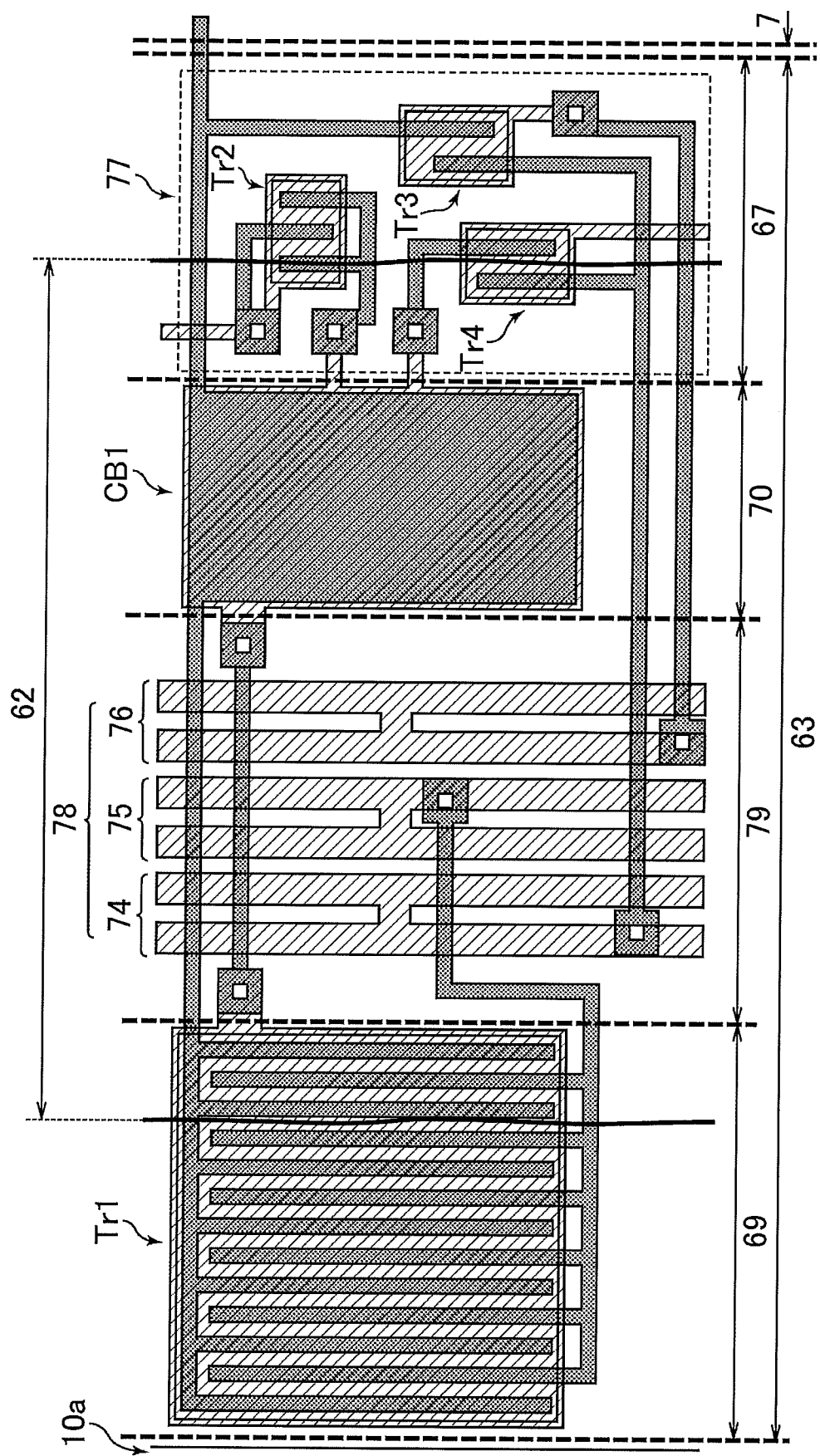
FIG. 18 is a schematic plan view illustrating the configuration in the picture-frame region of the liquid crystal display according to Embodiment 5.
Figure 19:
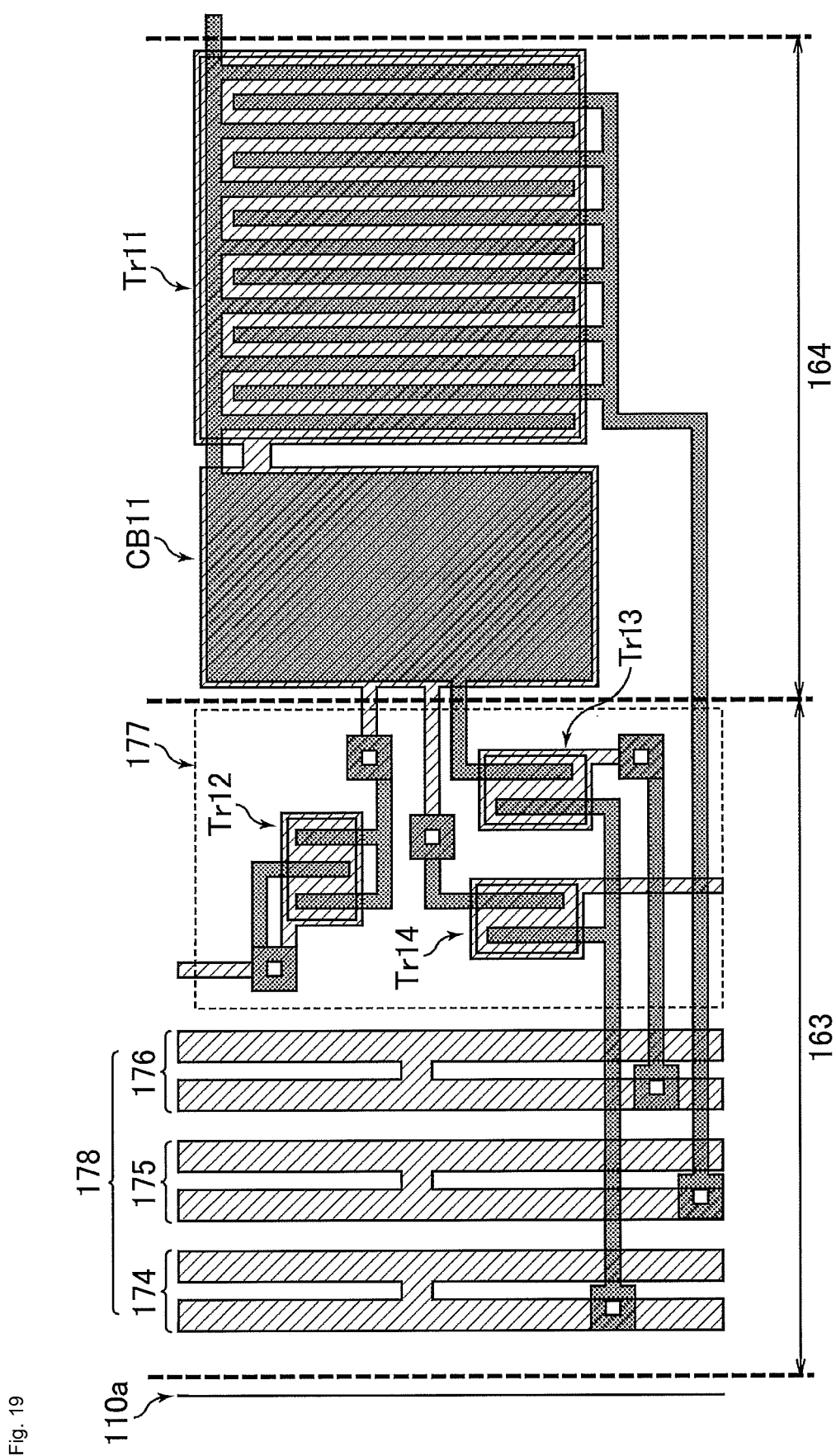
FIG. 19 is a schematic plan view illustrating the configuration in the picture-frame region of the liquid crystal display according to Comparative Embodiment 1.

In the present embodiment, as illustrated in FIG. 18, transistors Tr2 to Tr4 (control element region 77) are arranged in a region between a display region 7 and a bootstrap capacitor CB1, and a wiring group 78 is arranged in a region between an output transistor Tr1 and the bootstrap capacitor CB1.

An array substrate 10 includes a strip region (hereinafter referred to as a seal-coating region) 63 sandwiched between thick dashed lines, and a seal 62 is formed in a strip on the seal-coating region 63 not to protrude from the seal-coating region 63. One end of the seal-coating region 63 is set in a region between the output transistor Tr1 and an end 10a of the array substrate 10, whereas the other end is set in a region between the transistors Tr2 to Tr4 (control element region 77) and the display region 7. The seal-coating region 63 includes a region 69 in which the output transistor Tr1 is arranged, a region 70 in which the bootstrap capacitor CB1 is arranged, a region 67 in which the transistors Tr2 to Tr4 are arranged, and a region 79 in which wiring 74 to 76 (wiring group 78) are arranged. The regions 67 and 79 correspond to the above-described first region, and the regions 69 and 70 correspond to the above-described second region. In this way, in the present embodiment, different from Comparative Embodiment 1, the output transistor Tr1 and the bootstrap capacitor CB1 are arranged in the seal-coating region 63.

The seal 62 is (1) arranged to cover at least part or all of the output transistor Tr1 and part or all of the wiring 74, or (2) arranged to cover at least part or all of the bootstrap capacitor CB1 and a partial region or entire region of the control element region 77. In addition, the seal 62 includes a first portion that is adjacent to a liquid crystal layer 61 and a second portion that is adjacent to the first portion. In each of the cases (1) and (2), as long as the seal 62 does not protrude from the seal-coating region 63 and the first portion is not arranged on the bootstrap capacitor CB1, it is not particularly limited whether the seal 62 covers regions other than these regions.

In the case of (1), for example, the seal 62 may be arranged to cover all of the output transistor Tr1 and all of the wiring group 78. The seal 62 may be arranged to cover part or all of the output transistor Tr1, all of the wiring group 78, all of the bootstrap capacitor CB1, and a partial region or entire region of the control element region 77.

In the case of (2), for example, the seal 62 may be arranged to cover all of the bootstrap capacitor CB1 and the entire region of the control element region 77. The seal 62 may be arranged to cover part or all of the wiring group 78, all of the bootstrap capacitor CB1, and a partial region or entire region of the control element region 77. The seal 62 may be arranged to cover part or all of the output transistor Tr1, all of the wiring group 78, all of the bootstrap capacitor CB1, and a partial region or entire region of the control element region 77.

In the present embodiment, the output transistor Tr1 is arranged in a region between the end 10a of the array substrate 10 and the wiring group 78, and the bootstrap capacitor CB1 is arranged in a region between the end 10a of the array substrate 10 and the control element region 77. Accordingly, the wiring group 78 can be arranged on a display region 7 side of the output transistor Tr1, and the control element region 77 can be arranged on a display region 7 side of the bootstrap capacitor CB1. In addition, it is possible to perform provisional hardening and main hardening of a sealing material on the region 67 in which the transistors Tr2 to Tr4 are arranged, and on the region 79 in which the wiring group 78 is arranged. On the other hand, it is possible to perform main hardening of the sealing material on the region 69 in which the output transistor Tr1 is arranged, and on the region 70 in which the bootstrap capacitor CB1 is arranged. Consequently, it is possible to control the sealing material component from dissolving in the liquid crystal layer by the time of completion of the main seal hardening process. In addition, it is possible to define the seal-coating region 63 to be wider. Furthermore, it is possible to control occurrence of liquid crystal leakage. Therefore, in the same manner as in Embodiment 1, it is possible to reduce occurrence of quality problems and to improve adhesive strength between substrates.

However, the present embodiment differs from Embodiment 1 in that the sealing material portion that undergoes provisional hardening and main hardening is separately arranged.

In Embodiment 5, arrangement places of the output transistor Tr1 and the bootstrap capacitor CB1 may be transposed, and arrangement places of the control element region 77 and the wiring group 78 may be transposed.

Various variations of Embodiments 1 to 5 will be described below. A semiconductor material of each TFT is not particularly limited, but can be suitably selected. Examples of semiconductor materials include a group 14 element semiconductor, such as silicon, and an oxide semiconductor. Furthermore, crystallinity of a semiconductor material of each TFT is not particularly limited, but may be a single crystal, a polycrystal, an amorphous, or a microcrystal, and may include two or more types of these crystal structures. However, when an output transistor contains amorphous silicon, from a viewpoint of enlarging its driving capability, a channel width of the output transistor and a size of a bootstrap capacitor become particularly large. Therefore, the output transistor containing amorphous silicon can remarkably perform an effect of reducing occurrence of quality problems and an effect of improving adhesive strength of the seal. The oxide semiconductor preferably contains oxygen (O), and at least one element selected from the group consisting of indium (In), gallium (Ga), zinc (Zn), aluminum (Al), and silicon (Si). More preferably, the oxide semiconductor contains In, Ga, Zn, and O.

A type of each TFT is not particularly limited to a bottom gate type, but can be suitably selected.

Furthermore, a TFT other than a gate driver TFT may further be arranged in the picture-frame region.

In addition, the number and arrangement place of the unit circuit that satisfies the above-described layout are not particularly limited, but can be suitably configured. That is, at least one unit circuit may include either one of the above-described layouts, and part or all of the unit circuits may include either one of the above-described layouts. However, from a viewpoint of performing the above-described effect particularly effectively, all the unit circuits preferably include either one of the above-described layouts.

Furthermore, a type of an element and wiring of each gate driver is not particularly limited, but can be suitably determined, except for an output transistor and a bootstrap capacitor.

Embodiments 1 to 5 may be combined with each other. For example, unit circuits of different layouts may be formed in a common shift register, and a plurality of shift registers may include unit circuits of layouts different from each other.

REFERENCE SIGNS LIST 1 liquid crystal panel
2 display section
3 pixel
4 pixel TFT
5 drive circuit for source bus lines (source driver)
6a, 6b drive circuit for gate bus lines (gate driver)
7 display region
8 picture-frame region
9 pixel electrode
10 array substrate
10a end
11 insulating substrate
12, S1 to Sm source bus lines
13, G1 to Gn gate bus lines
14 common transfer electrode
16 common trunk wiring
17 common bus line
18,19 lead-out wiring
25 input wiring
26, 27, 28, 29, 30 terminal
31 first electrode
32 second electrode
41 gate electrode
42 gate insulator
43 i layer (semiconductor active layer)
44 n+ layer
45 source electrode
46 drain electrode
47,48 insulating layer
50 opposed substrate
51 insulating substrate
52 black matrix (BM)
61 liquid crystal layer
62 seal
63 seal-coating region
64 to 69, 70, 79 region
71 pixel array
72 display control circuit
73a, 73b shift register
74 to 76 wiring
77 control element region
78 wiring group
Pij pixel circuit
SR1 to SRn unit circuit
INa, INb input terminal
CKA, CKB clock terminal
VSS power terminal
OUT output terminal
Tr1 to Tr4 transistor
CB1 bootstrap capacitor

The invention claimed is:
1. A liquid crystal display comprising:
a first substrate,
a second substrate facing said first substrate, and
a seal provided between said first substrate and said second substrate, wherein
said first substrate includes an insulating substrate, a shift register monolithically formed on said insulating substrate, a plurality of bus lines, a first end of said insulating substrate, and a display region,
said shift register includes a plurality of multistage-connected unit circuits and a wiring connected to said plurality of unit circuits, the shift register being arranged in a region between said first end and said display region;
at least one of said plurality of unit circuits includes:
a clock terminal into which a clock signal is input,
an output terminal connected to a corresponding bus line among said plurality of bus lines, the output terminal outputting an output signal, a first transistor with one of a source and a drain being connected to said clock terminal and the other of said source and said drain being connected to said output terminal, a second transistor directly electrically connected to a gate of said first transistor, and a capacitor with a first terminal being connected to said gate of said first transistor and a second terminal being connected to said output terminal, said wiring includes at least one of
- a first wiring connected to said plurality of unit circuits and supplying a low-level potential to said plurality of unit circuits and
- a second wiring connected to said plurality of unit circuits and transmitting a clock signal to said plurality of unit circuits;

in a layout diagram of one of said plurality of unit circuits,
said capacitor is a separate component independently arranged at a position different from said first transistor, at least a portion of said first transistor and at least a portion of said capacitor are arranged in a region between said first end and one of said wiring and said second transistor, at least a portion of said first transistor and at least a portion of said capacitor are arranged in a region between said wiring and said second transistor, one of said wiring and said second transistor is arranged at a display region side of at least a portion of said capacitor, and said first transistor, said second transistor, and said capacitor are arranged in a substantially straight line in a first direction that is perpendicular to a direction along which said first end extends.

2. The liquid crystal display according to claim 1, wherein said second transistor is arranged in a region between said first end and one of said first transistor and said capacitor.

3. The liquid crystal display according to claim 1, wherein said wiring is arranged in a region between said first end and one of said first transistor and said capacitor.

4. The liquid crystal display according to claim 1, wherein
said first substrate includes a first region in which at least one of said wiring and said second transistor are arranged, and a second region in which at least one of said first transistor and said capacitor are arranged, said seal includes a first portion adjacent to a liquid crystal layer and a second portion adjacent to said first portion, said first portion is arranged on said first region, and
said second portion is arranged on said second region.

5. The liquid crystal display according to claim 1, wherein said seal includes a hardened article of a light-hardening and thermo-hardening material.

6. The liquid crystal display according to claim 1, wherein said second substrate includes a light shielding member that faces said shift register.

7. The liquid crystal display according to claim 1, wherein
said first substrate includes a plurality of pixel circuits provided in said display region, each of said plurality of pixel circuits includes a pixel transistor and a pixel electrode connected to said pixel transistor, and each of said plurality of bus lines is connected to a plurality of corresponding pixel transistor gates not via said shift register.

8. The liquid crystal display according to claim 1, wherein at least a portion of said first transistor and at least a portion of said second transistor are arranged in a region defined by virtually extending said capacitor in said first direction.

9. The liquid crystal display according to claim 1, wherein at least a portion of said capacitor is located between said first transistor and said second transistor.

* * * * *